US 008753738B2

(12) United States Patent
Millward et al.

(10) Patent No.: US 8,753,738 B2
(45) Date of Patent: Jun. 17, 2014

(54) REGISTERED STRUCTURE FORMATION VIA THE APPLICATION OF DIRECTED THERMAL ENERGY TO DIBLOCK COPOLYMER FILMS

(71) Applicant: Micron Technology, Inc., Boise, ID (US)

(72) Inventors: Dan B. Millward, Boise, ID (US); Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/784,353

(22) Filed: Mar. 4, 2013

(65) Prior Publication Data

US 2013/0189492 A1  Jul. 25, 2013

Related U.S. Application Data

(60) Division of application No. 13/337,567, filed on Dec. 27, 2011, now Pat. No. 8,409,449, which is a continuation of application No. 11/714,336, filed on Mar. 6, 2007, now Pat. No. 8,083,953.

(51) Int. Cl.
B32B 3/02 (2006.01)

(52) U.S. Cl.
USPC .......................................... 428/172; 428/156

(58) Field of Classification Search
CPC ... H01L 2224/0519; H01L 49/00; B32B 5/00; B32B 5/02; B32B 5/14
USPC ......... 428/141, 147, 156, 159, 160, 172, 173, 428/195.1
See application file for complete search history.

(56) References Cited

U.S. PATENT DOCUMENTS

| 4,623,674 A | 11/1986 | Bailey, Jr. |
| 4,797,357 A | 1/1989 | Mura et al. |
| 4,818,713 A | 4/1989 | Feygenson |
| 4,877,647 A | 10/1989 | Klabunde |
| 5,328,810 A | 7/1994 | Lowrey et al. |
| 5,374,367 A | 12/1994 | Edamura et al. |
| 5,382,373 A | 1/1995 | Carlson et al. |
| 5,482,656 A | 1/1996 | Hiraoka et al. |

(Continued)

FOREIGN PATENT DOCUMENTS

| CN | 1562730 A | 1/2005 |
| CN | 1799131 A | 7/2006 |

(Continued)

OTHER PUBLICATIONS

Asakawa et al., Fabrication of Subwavelength Structure for Improvement in Light-Extraction Efficiency of Light-Emitting Devices Using a Self-Assembled Pattern of Block Copolymer, Applied Optics, vol. 44, No. 34, Dec. 1, 2005, pp. 7475-7482.

(Continued)

*Primary Examiner* — Aaron Austin
*Assistant Examiner* — Megha Mehta
(74) *Attorney, Agent, or Firm* — TraskBritt

(57) ABSTRACT

Methods for fabricating sub-lithographic, nanoscale linear microchannel arrays over surfaces without defined features utilizing self-assembling block copolymers, and films and devices formed from these methods are provided. Embodiments of the methods use a multi-layer induced ordering approach to align lamellar films to an underlying base film within trenches, and localized heating to anneal the lamellar-phase block copolymer film overlying the trenches and outwardly over the remaining surface.

25 Claims, 17 Drawing Sheets

(56) References Cited

U.S. PATENT DOCUMENTS

| | | |
|---|---|---|
| 5,512,131 A | 4/1996 | Kumar et al. |
| 5,538,655 A | 7/1996 | Fauteux et al. |
| 5,580,700 A | 12/1996 | Rahman et al. |
| 5,620,850 A | 4/1997 | Bamdad et al. |
| 5,622,668 A | 4/1997 | Thomas |
| 5,772,905 A | 6/1998 | Chou |
| 5,834,583 A | 11/1998 | Hancock et al. |
| 5,849,810 A | 12/1998 | Muller et al. |
| 5,879,582 A | 3/1999 | Havelka et al. |
| 5,879,853 A | 3/1999 | Azuma |
| 5,891,356 A | 4/1999 | Inoue et al. |
| 5,904,824 A | 5/1999 | Oh et al. |
| 5,925,259 A | 7/1999 | Biebuyck et al. |
| 5,948,470 A | 9/1999 | Harrison et al. |
| 5,958,704 A | 9/1999 | Starzl et al. |
| 6,051,869 A | 4/2000 | Pan et al. |
| 6,111,323 A | 8/2000 | Carter et al. |
| 6,143,647 A | 11/2000 | Pan et al. |
| 6,153,495 A | 11/2000 | Kub et al. |
| 6,207,787 B1 | 3/2001 | Fahey et al. |
| 6,251,791 B1 | 6/2001 | Tsai et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo et al. |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa et al. |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,767,693 B1 | 7/2004 | Okoroanyanwu |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays et al. |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,066,801 B2 | 6/2006 | Balijepalli et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv et al. |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner et al. |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,279,396 B2 | 10/2007 | Derderian et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,083,953 B2 | 12/2011 | Millward et al. |
| 8,083,958 B2 | 12/2011 | Li et al. |
| 8,097,175 B2 | 1/2012 | Millward et al. |
| 8,101,261 B2 | 1/2012 | Millward et al. |
| 8,114,300 B2 | 2/2012 | Millward |
| 8,114,306 B2 | 2/2012 | Cheng et al. |
| 8,294,139 B2 | 10/2012 | Marsh et al. |
| 2001/0024768 A1 | 9/2001 | Matsuo et al. |
| 2001/0049195 A1 | 12/2001 | Chooi et al. |
| 2002/0055239 A1 | 5/2002 | Tuominen et al. |

(56) References Cited

U.S. PATENT DOCUMENTS

| | | |
|---|---|---|
| 2002/0084429 A1 | 7/2002 | Craighead et al. |
| 2002/0158342 A1 | 10/2002 | Tuominen et al. |
| 2002/0167117 A1 | 11/2002 | Chou |
| 2003/0010241 A1 | 1/2003 | Fujihira et al. |
| 2003/0034329 A1 | 2/2003 | Chou |
| 2003/0068639 A1 | 4/2003 | Haneder et al. |
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |
| 2003/0157248 A1 | 8/2003 | Watkins et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski et al. |
| 2003/0222048 A1 | 12/2003 | Asakawa et al. |
| 2003/0235930 A1 | 12/2003 | Bao et al. |
| 2004/0023287 A1 | 2/2004 | Harnack et al. |
| 2004/0028875 A1 | 2/2004 | Van Rijn et al. |
| 2004/0058059 A1 | 3/2004 | Linford et al. |
| 2004/0084298 A1 | 5/2004 | Yao et al. |
| 2004/0124092 A1 | 7/2004 | Black |
| 2004/0125266 A1 | 7/2004 | Miyauchi et al. |
| 2004/0127001 A1 | 7/2004 | Colburn et al. |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou et al. |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol et al. |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0133697 A1 | 6/2005 | Potyrailo et al. |
| 2005/0147841 A1 | 7/2005 | Tavkhelidze |
| 2005/0159293 A1 | 7/2005 | Wan et al. |
| 2005/0167651 A1 | 8/2005 | Merkulov et al. |
| 2005/0176256 A1 | 8/2005 | Kudelka |
| 2005/0208752 A1 | 9/2005 | Colburn et al. |
| 2005/0238889 A1 | 10/2005 | Iwamoto et al. |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee et al. |
| 2006/0046480 A1 | 3/2006 | Guo |
| 2006/0060863 A1 | 3/2006 | Lu et al. |
| 2006/0062867 A1 | 3/2006 | Choi et al. |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black et al. |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells et al. |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1 | 8/2007 | Cannon et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu |
| 2007/0289943 A1 | 12/2007 | Lu et al. |
| 2007/0293041 A1 | 12/2007 | Yang |
| 2008/0032238 A1 | 2/2008 | Lu et al. |
| 2008/0038467 A1 | 2/2008 | Jagannathan et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233297 A1 | 9/2008 | de Jong et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0155579 A1 | 6/2009 | Greco et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |

(56) References Cited

U.S. PATENT DOCUMENTS

| | | | |
|---|---|---|---|
| 2009/0236309 A1 | 9/2009 | Millward et al. |
| 2009/0240001 A1 | 9/2009 | Regner |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward et al. |
| 2010/0316849 A1 | 12/2010 | Millward et al. |
| 2010/0323096 A1 | 12/2010 | Sills et al. |
| 2011/0232515 A1 | 9/2011 | Millward |
| 2012/0133017 A1 | 5/2012 | Millward et al. |
| 2012/0223053 A1 | 9/2012 | Millward et al. |

FOREIGN PATENT DOCUMENTS

| | | |
|---|---|---|
| CN | 101013662 A | 8/2007 |
| EP | 0784543 B1 | 4/2000 |
| EP | 1416303 A2 | 5/2004 |
| EP | 1906237 A2 | 4/2008 |
| EP | 1593164 B1 | 6/2010 |
| JP | 11080414 | 3/1999 |
| JP | 2003155365 | 5/2003 |
| JP | 2004335962 | 11/2004 |
| JP | 2005029779 A | 2/2005 |
| JP | 2006036923 | 2/2005 |
| JP | 2006055982 | 3/2006 |
| JP | 2006110434 A | 4/2006 |
| JP | 2005008882 | 7/2006 |
| JP | 2007194175 A | 8/2007 |
| JP | 2008036491 | 2/2008 |
| KR | 20060128378 | 12/2006 |
| KR | 20070029762 | 3/2007 |
| KR | 100771886 B1 | 11/2007 |
| TW | 200400990 | 3/1992 |
| TW | 200633925 | 10/1994 |
| TW | 200740602 | 1/1996 |
| TW | 584670 | 4/2004 |
| TW | 200419017 | 10/2004 |
| TW | 200511364 | 3/2005 |
| TW | 256110 | 6/2006 |
| TW | I253456 | 11/2007 |
| TW | 200802421 | 1/2008 |
| WO | 9007575 | 7/1990 |
| WO | 9706013 | 2/1997 |
| WO | 9839645 A1 | 9/1998 |
| WO | 9947570 | 9/1999 |
| WO | 0031183 | 6/2000 |
| WO | 0218080 A1 | 3/2002 |
| WO | 02081372 A2 | 10/2002 |
| WO | 03045840 A2 | 6/2003 |
| WO | 2005122285 A2 | 12/2005 |
| WO | 2006003592 A2 | 1/2006 |
| WO | 2006003594 A2 | 1/2006 |
| WO | 2006076016 | 7/2006 |
| WO | 2006078952 | 7/2006 |
| WO | 2006112887 A2 | 10/2006 |
| WO | 2007001294 | 1/2007 |
| WO | 2007013889 | 2/2007 |
| WO | 2007019439 | 2/2007 |
| WO | 2007024241 | 3/2007 |
| WO | 2007024323 | 3/2007 |
| WO | 2007055041 | 5/2007 |
| WO | 2008055137 A2 | 5/2008 |
| WO | 2008091741 | 7/2008 |
| WO | 2008096335 | 8/2008 |
| WO | 2008097736 | 8/2008 |
| WO | 2008118635 | 10/2008 |
| WO | 2008124219 | 10/2008 |
| WO | 2008130847 | 10/2008 |
| WO | 2008145268 | 12/2008 |
| WO | 2008156977 | 12/2008 |
| WO | 2009099924 | 8/2009 |
| WO | 2009102551 | 8/2009 |
| WO | 2009117238 | 9/2009 |
| WO | 2009117243 | 9/2009 |
| WO | 2009134635 | 11/2009 |

OTHER PUBLICATIONS

Black et al., Polymer Self Assembly in Semiconductor Microelectronics, IBM J. Res. & Dev. vol. 51, No. 5, Sep. 2007, pp. 605-633.
Black, C .T., et al., "Integration of Self Assembly for Semiconductor Microelectronics," IEEE 2005 Custom Integrated Circuits Conference, IBM T.J. Watson Research Center, pp. 87-91.
Chai et al., Assembly of Aligned Linear Metallic Patterns on Silicon, Nature Nanotechnology, vol. 2, Aug. 2007, pp. 500-506.
Chai et al., Using Cylindrical Domains of Block Copolymers to Self-Assemble and Align Metallic Nanowires, American Chemical Society, www.acsnano.org, 2008. pp. A-M.
Chen et al., Highly Ordered Arrays of Mesoporous Silica Nanorods with Tunable Aspect Ratios from Block Copolymer Thin Films, Advanced Materials, vol. 20, 2008, pp. 763-767.
Cho et al., Nanoporous Block Copolymer Micelle/Micelle Multilayer Films with Dual Optical Properties, J. Am. Chem. Soc., vol. 128, No. 30, 2006, pp. 9935-9942.
Clark et al., Selective Deposition in Multilayer Assembly: SAMs as Molecular Templates, Supramolecular Science, vol. 4, 1997, pp. 141-146.
Erlandsson et al., Metallic Zinc Reduction of Disulfide Bonds Between Cysteine Residues in Peptides and Proteins, Int'l J. Peptide Res. & Therapeutics, vol. 11, No. 4, Dec. 2005, pp. 261-265.
Fasolka et al., Block Copolymer Thin Films: Physics and Applications, Annual Reviews Materials Res., vol. 31, Aug. 2001, pp. 323-355.
Gates, "Nanofabrication with Molds and Stamps," Materials Today, pp. 44-49, (Feb. 2005).
Grubbs, Hybrid Metal-Polymer Composites from Functional Block Copolymers, Journal of Polymer Science: Part A: Polymer Chemistry, vol. 43, pp. 4323-4336 (2005).
Guarini et al., Nanoscale Patterning Using Self-Assembled Polymers for Semiconductor Applications, J. Vac. Sci. Technol. B 19(6), pp. 2784-2788, Nov./Dec. 2001.
Hadziioannou, Semiconducting Block Copolymers for Self-Assembled Photovoltaic Devices, MRS Bulletin, pp. 456-460 (2002).
Hamers, Robert J., "Passivation and activation: How do monovalent atoms modify the reactivity of silicon surfaces? A perspective on the article, 'The mechanism of amine formation on Si(100) activated with chlorine atoms,'" Surface Science, vol. 600, pp. 3361-3362, 2006.
Hayward et al., Crosslinked Poly(styrene)-block-Poly(2-vinylpyridine) Thin Films as Swellable Templates for Mesostructured Silica and Titania, Advanced Materials, vol. 17, 2005, pp. 2591-2595.
Helmuth, Jo A., et al., "High-Speed Microcontact Printing," J. Am. Chem. Soc., vol. 128, No. 29, pp. 9296-9297, 2006.
Horiuchi et al., Three-Dimensional Nanoscale Alignment of Metal Nanoparticles Using Block Copolymer Films as Nanoreactors, Langmuir, vol. 19, pp. 2963-2973 (2003).
Huang et al., "Stretchable gold conductors on elastomeric substrates," Applied Physics Letters, vol. 82, No. 15, Apr. 14, 2003, pp. 2404-2406.
Huang et al., "Using Surface Active Random Copolymers to Control the Domain Orientation in Diblock Copolymer Thin Films," Macromolecules, 1998, 31, 7641-7650.
Hur et al., "Nanotransfer printing by use of noncovalent surface forces: Applications to thin-film transistors that use single-walled carbon nanotube networks and semiconducting polymers," Applied Physics Letters, vol. 85, No. 23, Dec. 6, 2004, pp. 5730-5732.
Jiang, Xingyu, et al., "Electrochemical Desorption of Self-Assembled Monolayers Noninvasively Releases Patterned Cells from Geometrical Confinements," J. Am. Chem. Soc., vol. 125, No. 9, pp. 2366-2367, 2003.

(56) References Cited

OTHER PUBLICATIONS

Johnson, Daniel L., et al., "Probing the stability of the disulfide radical intermediate of thioredoxin using direct electrochemistry," Letters in Peptide Science, vol. 10, pp. 495-500, 2003.

Jun, Yongseok, et al., "Patterning protein molecules on poly(ethylene glycol) coated Si(111)," Biomaterials, vol. 25, pp. 3503-3509, 2004.

Kavakli et al., Single and Double-Layer Antireflection Coatings on Silicon, Turk J Phys, vol. 26, pp. 349-354 (2002).

Krishnamoorthy et al., Block Copolymer Micelles as Switchable Templates for Nanofabrication, Languir, vol. 22, No. 8, Mar. 17, 2006, pp. 3450-3452.

Krishnamoorthy et al., Nanopatterned Self-Assembled Monolayers by Using Diblock Copolymer Micelles as Nanometer-Scale Adsorption and Etch Masks, Advanced Materials, 2008, pp. 1-4.

Kuhnline et al., "Detecting thiols in a microchip device using micromolded carbon ink electrodes modified with cobalt phthalocyanine", Analyst, vol. 131, pp. 202-207, (2006).

Li, Yong, et al., "A Method for Patterning Multiple Types of Cells by Using Electrochemical Desorption of Self-Assembled Monolayers within Microfluidic Channels," Angew. Chem. Int. Ed., vol. 46, pp. 1094-1096, 2007.

Liu et al., Pattern Transfer Using Poly(styrene-block-methyl methacrylate) Copolymer Films and Reactive Ion Etching, J. Vac. Sci. Technol. B vol. 25, No. 6, Nov./Dec. 2007, pp. 1963-1968.

Loo et al., "Additive, nanoscale patterning of metal films with a stamp and a surface chemistry mediated transfer process: Applications in plastic electronics," Applied Physics Letters, vol. 81, No. 3, Jul. 15, 2002, pp. 562-564.

Lopes et al., Hierarchical Self-Assembly of Metal Nanostructures on Diblock Copolymer Scaffolds, Nature, vol. 414, Dec. 13, 2001, pp. 735-738.

Lutz, Jean-Francois, "1,3-Dipolar Cycloadditions of Azides and Alkynes: A Universal Ligation Tool in Polymer and Materials Science," Angew. Chem. Int. Ed., vol. 46, pp. 1018-1025, 2007.

Malenfant et al., Self-Assembly of an Organic-Inorganic Block Copolymer for Nano-Ordered Ceramics, Nature Nanotechnology, vol. 2, pp. 43-46 (2007).

Niu, Sanjun, et al., "Selective assembly of nanoparticles on block copolymer by surface modification," Nanotechnology, vol. 18, pp. 1-4, 2007.

Park et al., Fabrication of Highly Ordered Silicon Oxide Dots and Stripes from Block Copolymer Thin Films, Advanced Materials, vol. 20, pp. 681-685, 2008.

Park et al., High-Aspect-Ratio Cylindrical Nanopore Arrays and Their Use for Templating Titania Nanoposts, Advanced Materials, vol. 20, pp. 738-742, 2008.

Reed, M.A., et al., "Molecular random access memory cell," Appl. Phys. Lett., vol. 78, No. 23, pp. 3735-3737, Jun. 2001.

Sang et al., "Epitaxial self-assembly of block copolymers on lithographically defined nanopatterned substrates", Nature, vol. 24, pp. 411-414, (Jul. 2003).

Sato et al., Novel Antireflective Layer Using Polysilane for Deep Ultraviolet Lithography, J. Vac. Sci. Technol. B, vol. 17, No. 6, pp. 3398-3401 (1999).

Sohn et al., Fabrication of the Multilayered Nanostructure of Alternating Polymers and Gold Nanoparticles with Thin Films of Self-Assembling Diblock Copolymers, Chem, Mater, vol. 13, pp. 1752-1757 (2001).

Tadd et al, Spatial Distribution of Cobalt Nanoclusters in Block Copolymers, Langmuir, vol. 18, pp. 2378-2384 (2002).

Tang et al., Evolution of Block Copolymer Lithography to Highly Ordered Square Arrays, Science, vol. 322, No. 5900, Sep. 25, 2008, pp. 429-432.

Trimbach et al., Block Copolymer Thermoplastic Elastomers for Microcontact Printing, Langmuir, vol. 19, 2003, pp. 10957-10961.

Tseng et al., Enhanced Block Copolymer Lithography Using Sequential Infiltration Synthesis, J. of Physical Chemistry, Jul. 11, 2011, 16 pgs.

Xia et al., An Approach to Lithographically Defined Self-Assembled Nanoparticle Films, Advanced Materials, vol. 18, pp. 930-933 (2006).

Xia, Younan, et al., "Soft Lithography," Annu. Rev. Mater. Sci., vol. 28, pp. 153-184, 1998.

Xu et al., Electric Field Alignment of Symmetric Diblock Copolymer Thin Films, Department of Polymer Science and Engineering, University of Massachusetts, 5 pages (2003).

Xu et al., Interfacial Interaction Dependence of Microdomain Orientation in Diblock Copolymer Thin Films, Macromolecules, vol. 38, pp. 2802-2805 (2005).

Xu et al., Surface-Initiated Atom Transfer Radical Polymerization from Halogen-Terminated Si(111) (Si—X, X=Cl, Br) Surfaces for the Preparation of Well-Defined Polymer—Si Hybrids, Langmuir, vol. 21, No. 8, 2005, pp. 3221-3225.

Yang et al., Covalently Attached Graft Polymer Monolayer on Organic Polymeric Substrate via Confined Surface Inhibition Reaction, Journal of Polymer Science—A—Polymer Chemistry Edition, 2007, pp. 745-755, vol. 45, Issue 5.

Yu et al., Contact Printing Beyond Surface Roughness: Liquid Supramolecular Nanostamping, Advanced Materials, vol. 19, 2007, pp. 4338-4342.

Zaumseil et al., "Three-Dimensional and Multilayer Nanostructures Formed by Nanotransfer Printing," Nano Letters, 2003, vol. 3, No. 9, pp. 1223-1227.

Zhang et al., "Self-Assembled Monolayers of Terminal Alkynes on Gold," J. Am. Chem. Soc., vol. 129, No. 16, pp. 4876-4877, 2007.

Zhao et al., Colloidal Subwavelength Nanostructures for Antireflection Optical Coatings, Optics Letters, vol. 30, No. 14, pp. 1885-1887 (2005).

Zhou et al., Nanoscale Metal/Self-Assembled Monolayer/Metal Heterostructures, Appl. Phys. Lett., vol. 71, No. 5, Aug. 4, 1997, pp. 611-613.

Zhu, X.Y., et al., "Grafting of High-Density Poly(Ethylene Glycol) Monolayers on Si(111)," Langmuir, vol. 17, pp. 7798-7803, 2001.

Ali, H. A., et al., Properties of Self-assembled ZnO Nanostructures, Solid-State Electronics 46 (2002), 1639-1642.

Arshady, R., et al., "The Introduction of Chloromethyl Groups into Styrene-based Polymers, 1," Makromol. Chem., vol. 177, 1976, p. 2911-2918.

Bae, Joonwon, "Surface Modification Using Photo-Crosslinkable Random Copolymers", Abstract submitted for the Mar. 2006 meeting of The American Physical Society, submitted Nov. 30, 2005. (Accessed via the Internet [retrieved on Apr. 5, 2010], URL: http://absimage.aps.org/image/MWS_MAR06-2005-003641.pdf).

Balsara, C., et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.

Bang, J., "The Effect of Humidity on the Ordering of Tri-block Copolymer Thin Films," Abstract submitted for the Mar. 2007 meeting of The American Physical Society, submitted Nov. 20, 2006.

Bass, R. B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.

Bearinger, J. P., et al., "Chemisorbed Poly(propylene sulphide)-based Copolymers Resist Biomolecular Interactions," Nature Materials 2, 259-264, 2003, Published online Mar. 23, 2003.

Berry, B. C., et al., "Orientational Order in Block Copolymer Films Zone Annealed Below the Order-Disorder Transition Temperature," Nano Letters vol. 7, No. 9 Aug. 2007, Polymers Division, Nat'l. Inst. of Standards and Technology, Maryland, USA, pp. 2789-2794, (published on Web Aug. 11, 2007).

Berry, B. C., et al., "Effects of Zone Annealing on Thin Films of Block Copolymers", National Institute of Standard and Technology, Polymers Division, Maryland, USA, 2007, 2 pages.

Black, C . T., et al., "Integration of Self Assembly for Semiconductor Microelectronics," IEEE 2005 Custom Integrated Circuits Conference, IBM T.J. Watson Research Center, pp. 87-91.

Black, C. T., "Self-aligned self-assembly of multi-nanowire silicon field effect transistors," Appl. Phys. Lett., vol. 87, pp. 163116-1 through 163116-3, 2005.

(56) References Cited

OTHER PUBLICATIONS

Black, C. T., "Polymer Self-Assembly as a Novel Extension to Optical Lithography," ACSNano, vol. 1, No. 3, 2007, American Chemical Society, pp. 147-150.
Black, C. T., et al., "High-Capacity, Self-Assembled Metal-Oxide-Semiconductor Decoupling Capacitors," IEEE Electron Device Letters, vol. 25, No. 9, Sep. 2004, pp. 622-624.
Black, C. T., et al., "Nanometer-Scale Pattern Registration and Alignment by Directed Diblock Copolymer Self-Assembly," IEEE Transactions on Nanotechnology, vol. 3, No. 3, pp. 412-415, Sep. 2004.
Black, C. T., et al., "Self Assembly in Semiconductor Microelectronics: Self-Aligned Sub-Lithographic Patterning Using Diblock Copolymer Thin Films," Proc. of SPIE, vol. 6153, 615302 (2006).
Black, C. T., et al., Polymer Self Assembly in Semiconductor Microelectronics, IBM J. Res. & Dev. vol. 51, No. 5, Sep. 2007, pp. 605-633.
Botelho Do Rego, A. M, et al., "Diblock Copolymer Ultrathin Films Studied by High Resolution Electron Energy Loss Spectroscopy," Surface Science, 482-485 (2001), pp. 1228-1234.
Brydson, R. M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).
Bulpitt, P., et al, "New Strategy for Chemical Modification of Hyaluronic Acid: Preparation of Functionalized Derivatives and Their Use in the Formation of Novel Biocompatible Hydrogels," Journal of Biomedical Materials Research, vol. 47, Issue 2, pp. 152-169, Published online Aug. 13, 1999, Abstract only.
Canaria, C. A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).
Candau, F., et al., "Synthesis and Characterization of Polystyrene-poly(ethylene oxide) Graft Copolymers," Polymer, 1977, vol. 18, pp. 1253-1257.
Cavicchi, K. A., et al., "Solvent Annealed Thin Films of Asymmetric Polyisoprene—Polylactide Diblock Copolymers," Macromolecules 2007, vol. 40, 2007, Univ. of Massachusetts, pp. 1181-1186.
Cha, J. N., et al., Biomimetic Approaches for Fabricating High-Density Nanopatterned Arrays, Chem. Mater. vol. 19, 2007, pp. 839-843.
Chandekar, A., et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).
Chang, Li-Wen, "Diblock Copolymer Directed Self-Assembly for CMOS Device Fabrication," Proc. of SPIE, vol. 6156, 2006, 615611-1 to 615611-6.
Chang, Li-Wen, "Experimental Demonstration of Aperiodic Patterns of Directed Self-Assembly of Block Copolymer Lithography for Random Logic Circuit Layout," IEEE International Electron Devices Meeting (IEDM), paper 33.2, Dec. 6-8, San Francisco, 2010, pp. 33.2.1-33.2.4.
Cheng, J. Y., et al., "Rapid Directed Self Assembly of Lamellar Microdomains from a Block Copolymer Containing Hybrid," Applied Physics Letters, 91, 143106-143106-3 (2007).
Cheng, J. Y., et al., "Self-Assembled One-Dimensional Nanostructure Arrays," Nano Letters, vol. 6, No. 9, 2006, pp. 2099-2103.
Cheng, J.Y., et al., "Templated Self-Assembly of Block Copolymers: Effect of Substrate Topography," Adv. Mater. 2003, vol. 15, No. 19, pp. 1599-1602.
Choi, H. J., et al., "Magnetorheology of Synthesized Core-Shell Structured Nanoparticle," IEEE Transactions on Magnetics, vol. 41, No. 10, Oct. 2005, pp. 3448-3450.
Daoulas Kostas CH., et al., "Fabrication of Complex Three-Dimensional Nanostructures from Self-Assembling Block Copolymer Materials on Two-Dimensional Chemically Patterned Templates with Mismatched Symmetry," Physical Review Letters 96, week ending Jan. 27, 2006, pp. 036104-1-3.
Darling, S. B., "Directing the Self-assembly of Block Copolymers," Progress in Polymer Science, vol. 32, No. 10, Sep. 28, 2007, pp. 1152-1204.
Desai, Dr. Trejal A., et al., "Engineered Silicon Surfaces for Biomimetic Interfaces," Business Briefing: Medical Device Manufacturing & Technology, 2002.
Edwards, E. W., et al., "Mechanism and Kinetics of Ordering in Diblock Copolymer Thin Films on Chemically Nanopatterned Substrates," Journal of Polymer Science: Part B Polymer Physics, vol. 43, 3444-3459, 2005.
Edwards, E. W., et al., "Precise Control over Molecular Dimensions of Block-Copolymer Domains Using the Interfacial Energy of Chemically Nanopatterned Substrates," Advanced Mater., 16, No. 15, Aug. 4, 2004, pp. 1315-1319.
Elisseeff, J., et al., "Photoencapsulation of Chondrocytes in Poly(ethylene oxide)-based Semi-interpenetrating Networks," Journal of Biomedical Materials Research, 51(2): 164-171, Aug. 2000, Abstract only.
Fasolka, M. J. et al., "Morphology of Ultrathin Supported Diblock Copolymer Films: Theory and Experiment," Macromolecules 2000, vol. 33, No. 15, pp. 5702-5712.
Fukunaga, K., et al., "Self-Assembly of Block Copolymer Thin Films Having a Half-Domain-Spacing Thickness: Nonequilibrium Pathways to Achieve Equilibrium Brush Layers Parallel to Substrate," Macromolecules vol. 39, Aug. 2006, pp. 6171-6179.
Gates, B. D., et al., "Unconventional Nanofabrication," Annu. Rev. Mater. Res. 2004, 34:339-72.
Ge, Zhenbin, et al., "Thermal Conductance of Hydrophilic and Hydrophobic Interfaces," PRL 96, 186101-1-186101-4, The American Physical Society, week ending May 12, 2006.
Gelest Inc., "Silane Coupling Agents: Connecting Across Boundaries," v2.0, 2006, pp. 1-56.
Genua, A., et al., "Functional Patterns Obtained by Nanoimprinting Lithography and Subsequent Growth of Polymer Brushes," Nanotechnology, 18, (2007), IOP Publishing Ltd., pp. 1-7.
Gillmor, S. D., et al., "Hydrophilic/Hydrophobic Patterned Surfaces as Templates for DNA Arrays," Langmuir 2000, vol. 16, No. 18, 2000, pp. 7223-7228.
Gudipati, C. S., et al., "Hyperbranched Fluoropolymer and Linear Poly(ethylene glycol) Based Amphiphilic Crosslinked Networks as Efficient Antifouling Coatings: An Insight into the Surface Compositions, Topographies, and Morphologies," Journal of Polymer Science Part A: Polymer Chemistry, vol. 42, (2004), pp. 6193-6208.
Guo, Kai, et al., Abstract of "Synthesis and Characterization of Novel Biodegradable Unsaturated Poly(ester amide)/Poly(ethylene glycol) Diacrylate Hydrogels", Journal of Polymer Science Part A: Polymer Chemistry, vol. 43, Issue 17, 2005 Wiley Periodicals, Inc., pp. 3932-3944.
Hamley, I. W., "Introduction to Block Copolymers", Developments in Block Copolymers Science and Technology, John Wiley & Sons, Ltd., 2004, pp. 1-29.
Hammond, M. R., et al., "Temperature Dependence of Order, Disorder, and Defects in Laterally Confined Diblock Copolymer Cylinder Monolayers," Macromolecules, vol. 38, Jul. 2005; American Chemical Society, p. 6575-6585.
Harrison, C., et al., "Layer by Layer Imaging of Diblock Copolymer Films with a Scanning Electron Microscope," Polymer, vol. 39, No. 13, 1998, pp. 2733-2744.
Hawker, C. J., et al., "Facile Synthesis of Block Copolymers for Nanolithographic Applications," Polymer Reprints, American Chemical Society (2005).
Hawker, C. J., et al., Abstract for "Improving the Manufacturability and Structural Control of Block Copolymer Lithography," Abstracts of Papers, 232nd ACS National Meeting, San Francisco, CA, Sep. 10-14, 2006.
Fujita et al., Thin Silica Film with a Network Structure as Prepared by Surface Sol-Gel Transcription on the Poly (styrene-b-4-vinylpyridine) Polymer Film, Chemistry Letters, vol. 32, No. 4, Dec. 31, 2003, pp. 352-353.

(56) References Cited

OTHER PUBLICATIONS

Melde et al., Silica Nanostructures Templated by Oriented Block Copolymer Thin Films Using Pore-Filling and Selective-Mineralization Routes, Chem. Mater., vol. 17, No. 18, Aug. 13, 2005, pp. 4743-4749.

Park, Dae-Ho, "The Fabrication of Thin Films with Nanopores and Nanogrooves from Block Copolymer Thin Films on the Neutral Surface of Self-assembled Monolayers," Nanotechnology 18, 2007, 355304, IIOP Publishing Ltd, UK, pp. 1-7.

Park, M., et al., "Block Copolymer Lithography: Periodic Arrays of 1011 Holes in 1 Square Centimeter," Science, vol. 276, No. 5317, May 30, 1997, pp. 1401-1404.

Park, Sang-Min, et al., "Directed assembly of lamellae-forming block copolymers using chemically and topographically patterned substrates," Advanced Materials, vol. 19, No. 4, pp. 607-611, Feb. 2007.

Park, Seung Hak, et al., "Block Copolymer Multiple Patterning Integrated with Conventional ArF Lithography," Soft Matter, 2010, 6, Royal Society of chemistry, pp. 120-125.

Park, Sung Chan, et al., "Controlled Ordering of Block Copolymer Thin Films by the Addition of Hydrophilic Nanoparticles," Macromolecules 2007, vol. 40, No. 22, American Chemical Society, pp. 8119-8124.

Peng, J., et. al., "Development of Nanodomain and Fractal Morphologies in Solvent Annealed Block copolymer Thin Films," Macromol. Rapid Commun. 2007, 28, pp. 1422-1428.

Peters, R. D., et al., "Combining Advanced Lithographic Techniques and Self-assembly of Thin Films of Diblock Copolymers to Produce Templates for Nanofabrication," J. Vac. Sci. Technol. B, vol. 18, No. 6, Nov./Dec. 2000, American Vacuum Society, pp. 3530-3532.

Peters, R. D., et al., "Morphology of Thin Films of Diblock Copolymers on Surfaces Micropatterned with Regions of Different Interfacial Energy," Macromolecules, vol. 35, No. 5, 2002, American Chemical Society, pp. 1822-1834.

Potemkin, Igor I., et al., "Effect of the Molecular Weight of AB Diblock Copolymers on the Lamellar Orientation in Thin Films: Theory and Experiment," Macromol. Rapid Commun., 2007, 28, pp. 579-584.

Resnick, D. J., et al., "Initial Study of the Fabrication of Step and Flash Imprint Lithography Templates for the Printing of Contact Holes," Microlith., Microfab., Microsyst., vol. 3, No. 2, Apr. 2004, Society of Photo-Optical Instrumentation Engineers, pp. 316-321.

Rogers, J. A., "Slice and Dice, Peel and Stick: Emerging Methods for Nanostructure Fabrication," ACS Nano, vol. 1, No. 3, 2007, pp. 151-153.

Rozkiewicz, Dorota I., et al., "'Click' Chemistry by Microcontact Printing," Angew. Chem. Int. Ed., vol. 45, pp. 5292-5296, 2006.

Ruiz, R., et al., "Density Multiplication and Improved Lighography by Directed Block Copolymer Assembly," Science, vol. 321, Aug. 15, 2008, pp. 936-939.

Ruiz, R., et al., "Induced Orientational Order in Symmetric Diblock Copolymer Thin-Films," Advanced Materials, vol. 19, No. 4, pp. 587-591, (2007).

Ryu, Du Yeol, et al., "Surface Modification with Cross-Linked Random Copolymers: Minimum Effective Thickness," Macromolecules, vol. 40, No. 12, 2007, American Chemical Society, pp. 4296-4300.

Saraf, Ravi R., et al., "Spontaneous Planarization of Nanoscale Phase Separated Thin Film," Applied Physics Letters, vol. 80, No. 23, Jun. 10, 2002, American Institute of Physics, pp. 4425-4427.

Sawhney, A. S., et al., "Bioerodible Hydrogels Based on Photopolymerized Poly(ethylene glycol)-co-poly(a-hydroxy acid) Diacrylate Macromers," Macromolecules 1993, 26, American Chemical Society, pp. 581-587, Abstract only.

Segalman, R. A., "Patterning with Block Copolymer Thin Films," Materials Science and Engineering R 48 (2005), Elsevier B. V., pp. 191-226.

Shahrjerdi, D., et al., "Fabrication of Ni Nanocrystal Flash Memories Using a Polymeric Self-Assembly Approach," IEEE Electron Device Letters, vol. 28, No. 9, Sep. 2007, pp. 793-796.

Sharma, S. et al., "Ultrathin Poly(ethylene glycol) Films for Silicon-based Microdevices," Applied Surface Science, 206 (2003), Elsevier Science B.V., pp. 218-229.

Sigma-Aldrich, 312-315 Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.

Sivaniah, E., et al., "Observation of Perpendicular Orientation in Symmetric Diblock Copolymer Thin Films on Rough Substrates," Macromolecules 2003, 36, American Chemical Society, pp. 5894-5896.

Sivaniah, et al., "Symmetric Diblock Copolymer Thin Films on Rough Substrates, Kinetics and Structure Formation in Pure Block Copolymer Thin Films," Macromolecules 2005, 38, American Chemical Society, pp. 1837-1849.

Solak, H. H., "Nanolithography with Coherent Extreme Ultraviolet Light," Journal of Physics D: Applied Physics, 2006, IOP Publishing Ltd., UK, pp. R171-R188.

Srinvivasan, C., et al., "Scanning Electron Microscopy of Nanoscale Chemical Patterns," ACS Nano, vol. 1, No. 3, pp. 191-201, 2007.

Stoykovich, M. P., et al., "Directed Assembly of Block Copolymer Blends into Nonregular Device-Oriented Structures," Science, vol. 308, Jun. 3, 2005, pp. 1442-1446.

Stoykovich, M. P., et al., "Directed Self-Assembly of Block Copolymers for Nanolithography: Fabrication of Isolated Features and Essential Integrated Circuit Geometries," ACS Nano, vol. 1, No. 3, 2007, pp. 168-175.

Sundrani, D., et al., "Guiding Polymers to Perfection: Macroscopic Alignment of Nanoscale Domains," Nano Lett., vol. 4, No. 2, 2004, American Chemical Society, pp. 273-276.

Sundrani, D., et al., "Hierarchical Assembly and Compliance of Aligned Nanoscale Polymer Cylinders in Confinement," Langmuir 2004, vol. 20, No. 12, 2004, American Chemical Society, pp. 5091-5099.

Truskett, V. M., et. al., "Trends in Imprint Lithography for Biological Applications," Trends in Biotechnology, vol. 24, No. 7, Jul. 2006, pp. 312-315.

Van Poll, M. L., et al., " a Self-Assembly Approach to Chemical Micropatterning of Poly(dimethylsiloxane)," Angew. Chem. Int. Ed. 2007, 46, pp. 6634-6637.

Wang, C., et al., "One Step Fabrication and characterization of Platinum Nanopore Electrode Ensembles formed via Amphiphilic Block Copolymer Self-assembly," Electrochimica Acta 52 (2006), pp. 704-709.

Wathier, M., et al., "Dendritic Macromers as in Situ Polymerizing Biomaterials for Securing Cataract Incisions," J. Am. Chem. Soc., 2004, 126 (40), pp. 12744-12745, Abstract only.

Winesett, D.A., et al., "Tuning Substrate Surface Energies for Blends of Polystyrene and Poly(methylmethacrylate)," Langmuir 2003, 19, American Chemical Society, pp. 8526-8535.

WIPF, "Handbook of Reagents for Organic Synthesis", 2005, John Wiley & Sons Ltd., p. 320.

Wu, C.Y., et al., "Self-Assembled Two-Dimensional Block Copolymers on Pre-patterned Templates with Laser Interference Lithography," IEEE, 2007, pp. 153-154.

Xiao, Shuaigang., et al., "Graphoepitaxy of Cylinder-forming Block Copolymers for Use as Templates to Pattern Magnetic Metal Dot Arrays," Nanotechnology 16, IPO Publishing Ltd, UK (2005), pp. S324-S329.

Xu, Ting, et al., "The Influence of Molecular Weight on Nanoporous Polymer Films," Polymer 42, Elsevier Science Ltd., (2001) pp. 9091-9095.

Yamaguchi, T., et al., "Resist-Pattern Guided Self-Assembly of Symmetric Diblock Copolymer," Journal of Photopolymer Science and Technology, vol. 19, No. 3, pp. 385-388 (2006).

Yamaguchi, Toru, et al., "Two-dimensional Arrangement of Vertically Oriented Cylindrical Domains of Diblock Copolymers Using Graphoepitaxy with Artificial Guiding Pattern Layout," Microprocesses and Nanotechnology, 2007, Conference date Nov. 5-8, 2007, pp. 434-435.

Yan, Xiaohu, et al., "Preparation and Phase Segregation of Block Copolymer Nanotube Multiblocks," J. Am. Chem. Soc., vol. 126, No. 32, 2004, American Chemical Society, pp. 10059-10066.

(56) References Cited

OTHER PUBLICATIONS

Yang, Xiao M., et al., "Guided Self-Assembly of Symmetric Diblock Copolymer Films on Chemically Nanopatterned Substrates," Macromolecules 2000, vol. 33, No. 26, 2000, American Chemical Society, pp. 9575-9582.
Yang, Xiaomin, et al., "Nanoscopic Templates Using Self-assembled Cylindrical Diblock Copolymers for Patterned Media," J. Vac. Sci. Technol. B 22(6), Nov./Dec. 2004, American Vacuum Society, pp. 3331-3334.
Yurt, Serkan, et al., "Scission of Diblock Copolymers into Their Constituent Blocks," Macromolecules 2006, vol. 39, No. 5, 2006, American Chemical Society, pp. 1670-1672.
Zehner, R. W., et al., "Selective Decoration of a Phase-Separated Diblock Copolymer with Thiol-Passivated Gold Nanocrystals," Langmuir, vol. 14, No. 2, pp. 241-244, Jan. 20, 1998.
Zhang, Mingfu, et al., "Highly Ordered Nanoporous Thin Films from Cleavable Polystyrene-block-poly(ethyleneoxide)," Adv. Mater. 2007, 19, pp. 1571-1576.
Zhang, Yuan, et al., "Phase Change Nanodot Arrays Fabricated Using a Self-Assembly Diblock Copolymer Approach," Applied Physics Letter, 91, 013104, 2007, American Institute of Physics, pp. 013104 to 013104-3.
Zhu, X. Y., et al., "Molecular Assemblies on Silicon Surfaces via Si—O Linkages," Langmuir, vol. 16, 2000, American Chemical Society, pp. 6766-6772.
He et al., "Self-Assembly of Block Copolymer Micelles in an Ionic Liquid," J. Am. Chem. Soc. 2006, 128, pp. 2745-2750.
Helmbold, A., et al., "Optical Absorption of Amorphous Hydrogenated Carbon Thin Films," Thin Solid Films 283 (1996) pp. 196-203.
Hermans, T. M., et al., "Application of Solvent-Directed Assembly of Block Copolymers to the Synthesis of Nanostructured Materials with Low Dielectric Constants", Angewandte Chem. Int. Ed., vol. 45, Issue 40, Oct. 13, 2006, pp. 6648-6652.
Hutchison, J. B, et al., "Polymerizable Living Free Radical Initiators as a Platform to Synthesize Functional Networks," Chem. Mater., vol. 17, No. 19, 2005, pp. 4789-4797.
Ikeda, Susumu, et al., "Control of Orientation of Thin Films of Organic Semiconductors by Graphoepitaxy," NanotechJapan Bulletin—vol. 3, No. 3, Dec. 17, 2010/Focus 26-06, NIMS International Center for Nanotechnology Network.
In, Insik, et al., "Side-Chain-Grafted Random Copolymer Brushes as Neutral Surfaces for Controlling the Orientation of Block Copolymer Microdomains in Thin Films," Langmuir, vol. 22, No. 18, 2006, Department of Materials Science and Engineering and Chemical and Biological Engineering, Univ. of Wisconsin-Madison, pp. 7855-7860.
Ji, Shengxiang, et al., "Generalization of the Use of Random Copolymers to Control the Wetting Behaviors of Block Copolymer Films," Macromolecules, 2008, 41(23): 9098-9103.
Ji, Shengxiang, et al., "Molecular Transfer Printing Using Block Copolymers," ACS Nano, vol. 4, No. 2, 2010, Dept. of Chemical and Biological Engineering, Univ. of Wisconsin, pp. 599-609.
Ji, Shengxiang, et al., "Preparation of Neutral Wetting Brushes for Block Copolymer Films from Homopolymer Blends," submitted to Advanced Materials, 20(16): 3054-3060; published online Jul. 7, 2008.
Jun, Y., et al., "Microcontact Printing Directly on the Silicon Surface," Langmuir, 2002, 18(9), pp. 3415-3417, Abstract only.
Karim, Alamgir, et al., "Control of Ordering Kinetics and Morphology Using Zone Annealing of Thin Block Copolymer Films", Abstract submitted for the Mar. 2007 Meeting of the American Physical Society, Nov. 20, 2006.
Kim, Is, et al., "Self-assembled Hydrogel Nanoparticles Composed of Dextran and Poly (ethylene glycol) Macromer," Int J Pharm., Sep. 15, 2000; 205(1-2): 109-116, Abstract only.
Kim, Sang Ouk, et al., "Epitaxial Self-assembly of Block Copolymers on Lithographically Defined Nanopatterned Substrates," Nature, vol. 424, Jul. 24, 2003, Dept. of Chemical Engineering and Center for Nanotechnology, and Dept. of Mechanical Engineering, Univ. of Wisconsin, pp. 411-414.

Kim, Sang Ouk, et al., "Novel Complex Nanostructure from Directed Assembly of Block Copolymers on Incommensurate Surface Patterns," Adv. Mater., 2007, 19, pp. 3271-3275.
Kim, Seung Hyun, et al., "Highly Oriented and Ordered Arrays from Block Copolymers via Solvent Evaporation," Adv. Mater. 2004, 16, No. 3, Feb. 3, pp. 226-231.
Kim, Seung Hyun, et al., "Salt Complexation in Block Copolymer Thin Films," Macromolecules 2006, vol. 39, No. 24, 2006, pp. 8473-8479.
Im, Seung Hyun, et al., "Solvent-Induced Ordering in Thin Film Diblock Copolymer/Homopolymer Mixtures," Advanced Mater., vol. 16, No. 23-24, Dec. 17, 2004, pp. 2119-2123.
Kim, SH, et al., "In Vitro Release Behavior of Dextran-methacrylate Hydrogels Using Doxorubicin and Other Model Compounds," J Biomater Appl., Jul. 2000; 15(1): 23-46 Abstract only.
Kim, SH, et al., "Synthesis and characterization of Dextran-methacrylate Hydrogels and Structural Study by SEM," J Biomater Res., Mar. 15, 2000; 49(4): 517-27 Abstract only.
Kim, Su-Jin, et al., "Hybrid Nanofabrication Processes Utilizing Diblock Copolymer Nanotemplate Prepared by Self-assembled Monolayer Based Surface Neutralization," J. Vac. Sci. Technol. B26(1), Jan./Feb. 2008, © 2008 American Vacuum Society, pp. 189-194.
Knoll, A., et al., "Phase Behavior in Thin Films of Cylinder-Forming Block Copolymers," Physical Review Letters vol. 89, No. 3 Jul. 2002, The American Physical Society, pp. 035501-1 to 035501-4.
Krishnamoorthy, S., et al., "Nanoscale Patterning with Block Copolymers," Materials Today, vol. 9, No. 9, Sep. 2006, pp. 40-47.
La, Young-Hye, et al., "Directed Assembly of Cylinder-Forming Block Copolymers into Patterned Structures to Fabricate Arrays of Spherical Domains and Nanoparticles," Chem. Mater, 2007, vol. 19, No. 18, Department of Chemical and Biological Engineering and Center for Nanotechnology, Univ. of Wisconsin, pp. 4538-4544.
La, Young-Hye, et al., "Pixelated Chemically Amplified Resists: Investigation of Material Structure on the Spatial Distribution of Photoacids and Line Edge Roughness," J. Vac. Sci. Technol. B 25(6), Nov./Dec. 2007, American Vacuum Society, pp. 2508-2513.
Laracuente, A.R., et al., "Step Structure and Surface Morphology of Hydrogen-terminated Silicon: (001) to (114)," Surface Science 545, 2003, pp. 70-84.
Lentz, D, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Molecular Imprints, Inc., Texas, USA, Feb. 2007, pp. 1-10.
Li, Mingqi, et al., "Block Copolymer Patterns and Templates," Materials Today, vol. 9, No. 9, Sep. 2006, pp. 30-39.
Li, Wai-Kin, et al, "Creation of Sub-20-nm Contact Using Diblock Copolymer on a 300 mm Wafer for Complementary Metal Oxide Semiconductor Applications," J. Vac. Sci. Technol. B 25(6), Nov./Dec. 2007, American Vacuum Society, pp. 1982-1984.
Li, Xue, et al., "Morphology Change of Asymmetric Diblock Copolymer Micellar Films During Solvent Annealing," ScienceDirect, Polymer 48 (2007), pp. 2434-2443.
Lin, Zhiqun, et al., "A Rapid Route to Arrays of Nanostructures in Thin Films," Adv. Mater. 2002, 14 No. 19, Oct. 2, pp. 1373-1376.
Lin-Gibson, Sheng, et al., "Structure—Property Relationships of Photopolymerizable Poly(ethylene glycol) Dimethacrylate Hydrogels," Macromolecules 2005, 38, American Chemical Society, pp. 2897-2902.
Lutolf, M., et al., "Cell-Responsive Synthetic Hydrogels," Adv. Mater., vol. 15, No. 11, Jun. 2003, pp. 888-892.
Lutolf, M.P., et al, "Synthetic Biomaterials as Instructive Extracellular Microenvironments for Morphogenesis in Tissue Engineering," Nature Biotechnology, 23, 47-55 (2005), Abstract only.
Malkoch, M., et al., "Synthesis of Well-defined Hydrogel Networks Using Click Chemistry," Chem. Commun., 2006, The Royal Society of Chemistry, pp. 2774-2776.
Mansky, P., et al., "Controlling Polymer-Surface Interactions with Random Copolymer Brushes," Science, vol. 275, Mar. 7, 1997, pp. 1458-1460.

(56) References Cited

OTHER PUBLICATIONS

Martens, P., et al., "Characterization of Hydrogels Formed from Acrylate Modified Poly(vinyl alcohol) Macromers," Polymer, vol. 41, Issue 21, Oct. 2000, pp. 7715-7722, Abstract only.

Matsuda, T., et al., "Photoinduced Prevention of Tissue Adhesion," ASAIO J, Jul.-Sep. 1992; 38(3): M154-7, Abstract only.

Maye, M. A., et al., "Chemical Analysis Using Force Microscopy," Journal of Chemical Education, vol. 79, No. 2, Feb. 2002, Dept. of Chemistry, State Univ. of New York at Binghamton, USA, pp. 207-210.

Metters, A., et al., "Network Formation and Degradation Behavior of Hydrogels Formed by Michael-Type Addition Reactions," Biomacromolecules 2005, 6, 2005, pp. 290-301.

Meyer, E., et al., "Controlled Dewetting Processes on Microstructured Surfaces—A New Procedure for Thin Film Microstructuring," Macromollecular Mater. Eng., 276/277, 2000, Institute of Polymer Research Dresden, pp. 44-50.

Mezzenga, R., et al., "On the Role of Block Copolymers in Self-Assembly of Dense Colloidal Polymeric Systems," Langmuir 2003, vol. 19, No. 20, 2003, American Chemical Society, pp. 8144-8147.

Mindel, J., et.al., "A Study of Bredig Platinum Sols", The Chemical Laboratories of New York University, received Jun. 10, 1943, vol. 65 pp. 2112.

Naito, K., et al., "2.5-Inch Disk Patterned Media Prepared by an Artificially Assisted Self-Assembling Method," IEEE Transactions on Magnetics, vol. 38, No. 5, Sep. 2002, pp. 1949-1951.

Nealey, P. F., et al., "Self-Assembling Resists for Nanolithography", IEEE 2005.

Nguyen, K. T., et al., "Photopolymerizable Hydrogels for Tissue Engineering Applications," Biomaterials 23, 2002, pp. 4307-4314.

Nishikubo, T., "Chemical Modification of Polymers via a Phase-Transfer Catalyst or Organic Strong Base," American Chemical Society Symposium Series, 1997, American Chemical Society, pp. 214-230.

Niu, Sanjun, et al., "Stability of Order in Solvent-Annealed Block Copolymer Thin Films," Macromolecules, vol. 36, No. 7, 2003, Univ. of Nebraska, USA, pp. 2428-2440, (web release date: Mar. 13, 2003) (http://digitalcommons.uni.edu/cgi/viewcontent.cgi?article+1005&contect=chemeng_nanotechnology).

Olayo-Valles, R., et al., "Large Area Nanolithographic Templates by Selective Etching of Chemically Stained Block Copolymer Thin Films," J. Mater. Chem, 2004, 14, The Royal Society of Chemistry, pp. 2729-2731.

Parejo, P. G., et al., "Highly Efficient UV-absorbing Thin-film Coatings for Protection of Organic Materials Against Photodegradation," J. Mater. Chem., 2006, 16, The Royal Society of Chemistry, pp. 2165-2169.

Park, Cheolmin, et al., "Enabling Nanotechnology with Self Assembled Block Copolymer Patterns," Polymer 44, 2003, pp. 6725-6760.

Black et al., Integration of Self-Assembled Diblock Copolymers for Semiconductor Capacitor Fabrication, Applied Physics Letters, vol. 79, No. 3, (2001), pp. 409-411.

Electronegativity—<http://www.princeton.edu/~achaney/tmve/wiki100k/docs/Electronegativity.html> website, visited Aug. 28, 2013, 1 page.

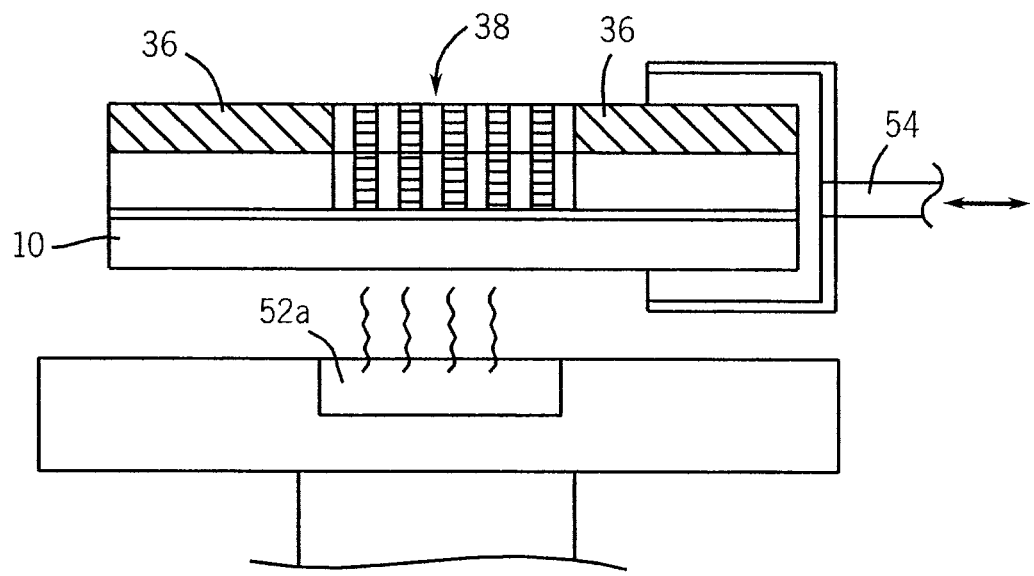
FIG. 11A
FIG. 11B
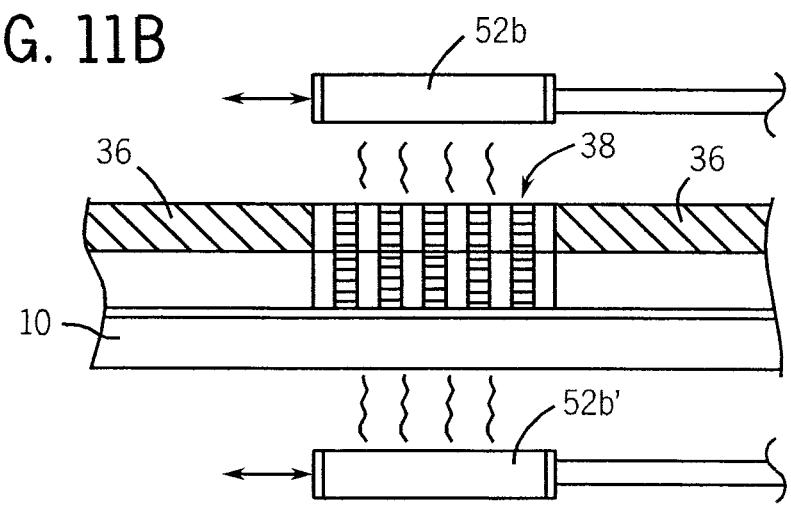

REGISTERED STRUCTURE FORMATION VIA THE APPLICATION OF DIRECTED THERMAL ENERGY TO DIBLOCK COPOLYMER FILMS

CROSS-REFERENCE TO RELATED APPLICATION

This application is a divisional of U.S. patent application Ser. No. 13/337,567, filed Dec. 27, 2011, now U.S. Pat. No. 8,409,449, issued Apr. 2, 2013, which is a continuation of U.S. patent application Ser. No. 11/714,336, filed Mar. 6, 2007, now U.S. Pat. No. 8,083,953, issued Dec. 27, 2011, the disclosure of each of which is hereby incorporated in its entirety by this reference.

TECHNICAL FIELD

Embodiments of the invention relate to methods of fabricating nanoscale linear arrays of microstructures and microchannels by use of thin films of self-assembling block copolymers, and devices resulting from those methods.

BACKGROUND

As the development of nanoscale mechanical, electrical, chemical and biological devices and systems increases, new processes and materials are needed to fabricate nanoscale devices and components. Conventional optical lithographic processing methods are not able to accommodate fabrication of structures and features much below a 100 nm level. The use of self-assembling diblock copolymers presents another route to patterning at nanometer dimensions. Diblock copolymer films spontaneously assemble into periodic structures by microphase separation of the constituent polymer blocks after annealing, for example, by thermal annealing above the glass transition temperature of the polymer or by solvent annealing, forming ordered domains at nanometer-scale dimensions. Following self-assembly, one block of the copolymer can be selectively removed and the remaining patterned film used as an etch mask for patterning nanosized features into the underlying substrate. Since the domain sizes and periods ($L_o$) involved in this method are determined by the chain length of a block copolymer (MW), resolution can exceed other techniques such as conventional photolithography, while the cost of the technique is far less than electron beam lithography or EUV photolithography, which have comparable resolution.

The film morphology, including the size and shape of the microphase-separated domains, can be controlled by the molecular weight and volume fraction of the AB blocks of a diblock copolymer to produce lamellar, cylindrical, or spherical morphologies, among others. For example, for volume fractions at ratios greater than about 80:20 of the two blocks (AB) of a diblock polymer, a block copolymer film will microphase separate and self-assemble into periodic spherical domains with spheres of polymer B surrounded by a matrix of polymer A. For ratios of the two blocks between about 60:40 and 80:20, the diblock copolymer assembles into a periodic hexagonal close-packed or honeycomb array of cylinders of polymer B within a matrix of polymer A. For ratios between about 50:50 and 60:40, lamellar domains or alternating stripes of the blocks are formed. Domain size typically ranges from 5 nm to 50 nm.

Diblock copolymer thin films of cylindrical and lamellar phases may both form striped phases relative to an interface. For cylindrical phase films, a striped pattern results from parallel cylinder orientation, while for lamellar phase films, a striped pattern results from perpendicular domain orientation. From a top down view, perpendicular-oriented lamellae and parallel-oriented cylinders appear similar, e.g., as parallel lines.

Graphoepitaxy techniques using defined topography such as trench edges have been used in an attempt to orient and order copolymer domains and control registration and alignment of the self-assembled blocks to form a desired pattern. By comparison, thin films prepared on a flat substrate and annealed do not have any preferential orientation of domains and will assemble into a disordered fingerprint-like structure despite extensive annealing. Although registered and ordered arrays of cylinders have been produced within trenches, the fabrication of an ordered array of repeat structures outside of the confines of the trenches and over large areas has not been realized in a manufacturable process.

It would be useful to provide a method of fabricating films of linear arrays of ordered nanostructures that overcome these problems.

BRIEF DESCRIPTION OF THE DRAWINGS

Embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

FIGS. 2A-6A illustrate diagrammatic top plan views of the substrate of FIG. 1A at various stages of the fabrication of a self-assembled block copolymer film according to an embodiment of the present disclosure. FIGS. 2B to 6B and 2C to 6C illustrate elevational, cross-sectional views of embodiments of a portion of the substrate depicted in FIGS. 2A-6A taken, respectively, along lines 2B/2C-2B/2C to lines 6B/6C-6B/6C.

FIGS. 11A and 11B illustrate embodiments of heating the substrate of FIG. 5B by zoned annealing techniques.

DETAILED DESCRIPTION OF THE INVENTION

Figure 1A:
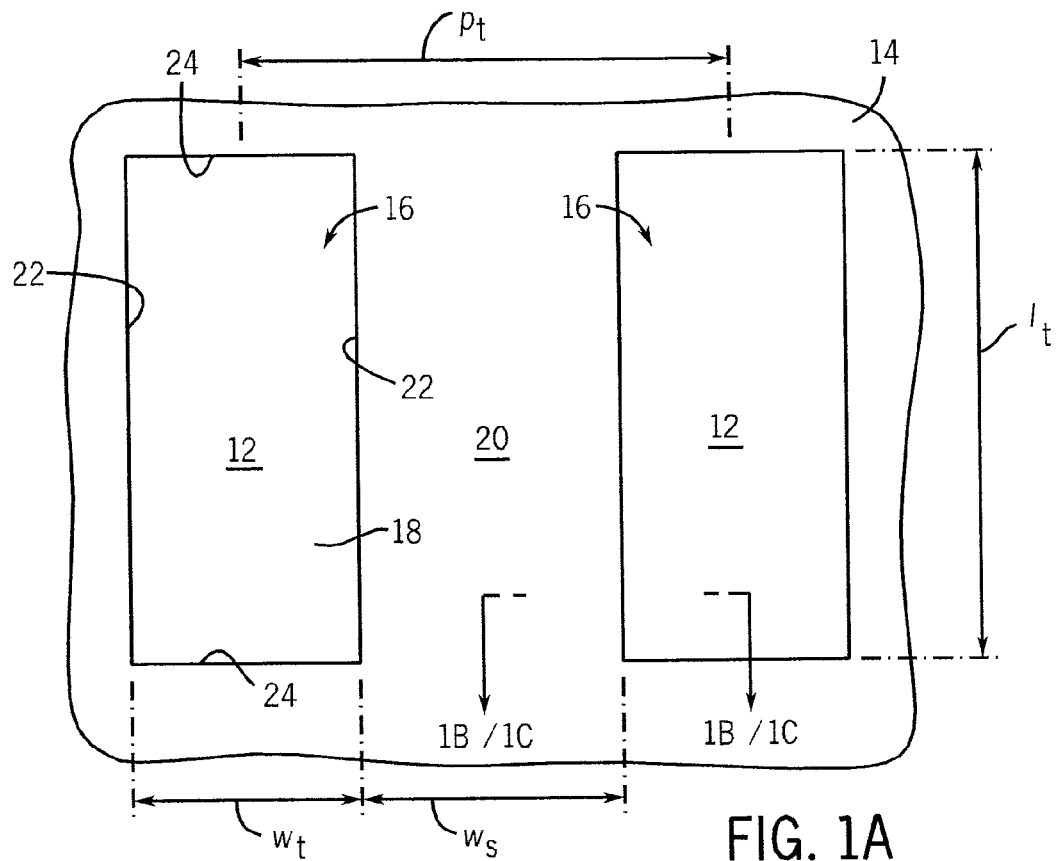
FIG. 1A illustrates a diagrammatic top plan view of a portion of a substrate at a preliminary processing stage according to an embodiment of the present disclosure, showing the substrate with trenches.

The following description with reference to the drawings provides illustrative examples of devices and methods according to embodiments of the invention. Such description is for illustrative purposes only and not for purposes of limiting the same.

In the context of the current application, the terms "semiconductor substrate," "semiconductive substrate," "semiconductive wafer fragment," "wafer fragment," or "wafer" will be understood to mean any construction comprising semiconductor material, including but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

"$L_o$" is the inherent pitch (bulk period or repeat unit) of structures that self-assemble upon annealing from a self-assembling (SA) block copolymer or a blend of a block copolymer with one or more of its constituent homopolymers.

Processing conditions of embodiments of the invention use a graphoepitaxy technique utilizing sidewalls of trenches as constraints to induce orientation and registration of a first film of a self-assembling diblock copolymer to form an ordered linear array pattern registered to the sidewalls of the trenches. The first polymer film is then used as a template or base layer for inducing ordering of a subsequently deposited lamellar-phase block copolymer film such that, upon annealing, lamellar domains within the trenches orient perpendicularly and are registered to underlying structures, resulting in a stacked double- or multi-layer structure having a striped pattern.

Steps in a method for fabricating thin films from self-assembling (SA) block copolymers that define nanometer-scale linear array patterns according to embodiments of the invention are illustrated in FIGS. 1A-12D.

The method first forms a multi-layer pattern within trenches by forming a polymer base film or template with ordered structures within the trenches for inducing the ordering of an overlying lamellar phase block copolymer film such that the lamellar domains are oriented perpendicularly and registered to the underlying assembled domains of the base film.

The base layer within the trenches can be formed from a lamellar-phase block copolymer film, which upon annealing, forms a registered lamellar array of alternating polymer-rich blocks that extend the length and are oriented parallel to the sidewalls and perpendicular to the floor of the trenches. In other embodiments, the base layer is formed from a cylindrical-phase block copolymer material, which upon annealing, forms lines of half-cylinders in a polymer matrix extending the length and oriented parallel to the sidewalls and floor of the trenches. The assembled base film is then used as a template for inducing the ordering of an overlying lamellar-phase block copolymer film such that the lamellar domains of the annealed film are oriented perpendicularly and registered to the underlying pattern of the base film within the trenches.

To produce a base polymer film within the trenches using a lamellar-phase block copolymer, the surface of the sidewalls and edges of the trenches are preferential wetting by one block of the copolymer and the trench floors are neutral wetting (equal affinity for both blocks of the copolymer) to allow both blocks of the copolymer material to wet the floor of the trench. Entropic forces drive the wetting of a neutral wetting surface by both blocks, resulting in the formation of a layer of perpendicular lamellae across the width of each trench.

Figure 1B:
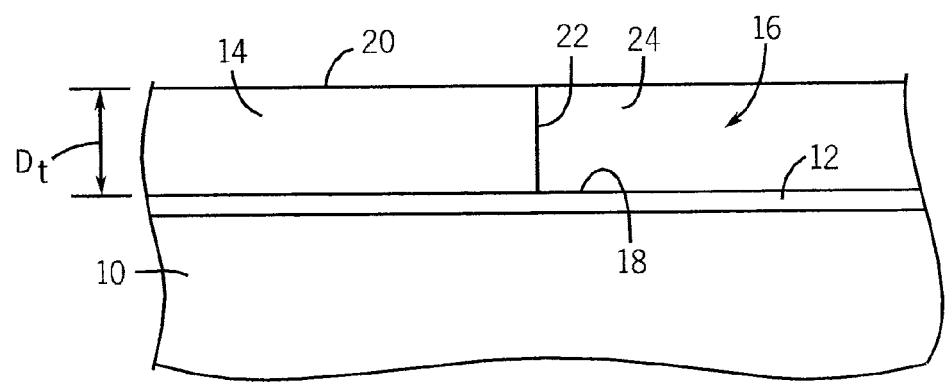
FIGS. 1B and 1C are elevational, cross-sectional views of embodiments of the substrate depicted in FIG. 1A taken along lines 1B/1C-1B/1C.

In an embodiment shown in FIGS. 1A and 1B, a substrate 10 is provided bearing a neutral wetting surface. The substrate 10 can comprise, for example, silicon (with native oxide), oxide (e.g., silicon oxide, $SiO_x$), or an inorganic film. In the illustrated embodiment, a neutral wetting layer 12 is formed on the substrate 10 prior to forming an overlying material layer 14 (e.g., oxide). Etching through the material layer 14 to form trenches 16 exposes an underlying neutral wetting layer 12 as a floor or bottom surface 18 of the trenches 16. The trenches 16 are separated by a spacer or crest 20 having a width ($w_s$) and are structured with opposing sidewalls 22, opposing ends or edges 24, a width ($w_t$), a length ($l_t$) and a depth ($D_t$).

A neutral wetting surface can be provided, for example, by applying a neutral wetting polymer to form the layer 12 on the surface of the substrate 10. In the use of a self-assembling (SA) diblock copolymer composed of PS-b-PMMA, a random PS:PMMA copolymer brush layer (PS-r-PMMA)), which exhibits non-preferential or neutral wetting toward PS and PMMA can be applied by spin-coating onto the surface of substrate 10. The brush can be affixed by grafting (on an oxide substrate) or by cross-linking (any surface) using UV radiation or thermal processing. For example, a random copolymer solution composed of PS and PMMA with hydroxyl end group(s) (e.g., about 58% PS) can be applied to the surface of the substrate 10 as a layer about 5 nm to 10 nm thick and end-grafted by heating at about 160° C. for about 48 hours.

In another embodiment, a surface that is neutral wetting to PS-b-PMMA can be prepared by spin-coating a blanket layer of a photo- or thermally cross-linkable random copolymer such as a benzocyclobutene- or azidomethylstyrene-functionalized random copolymer of styrene and methyl methacrylate (e.g., poly(styrene-r-benzocyclobutene r-methyl methacrylate (PS-r-PMMA-r-BCB))) onto the surface of the substrate 10 prior to forming the material layer 14. For example, such a random copolymer can comprise about 42% PMMA, about (58-x)% PS and x% (e.g., about 2% to 3%) of either polybenzocyclobutene or poly(para-azidomethylstyrene)). An azidomethylstyrene-functionalized random copolymer can be UV cross-linked (e.g., 1-5 mW/cm$^2$ exposure for about 15 seconds to about 30 minutes) or thermally cross-linked (e.g., at about 170° C.). A benzocyclobutene-functionalized random copolymer can be thermally cross-linked (e.g., at about 200° C. for about 4 hours or at about 250° C. for about 10 minutes).

Another neutral wetting surface for PS-b-PMMA can be provided by hydrogen-terminated silicon, which can be prepared by a conventional process, for example, by a fluoride ion etch of a silicon substrate 10 (with native oxide present, about 12 Å to 15 Å) for example, by immersion in aqueous solution of hydrogen fluoride (HF) and buffered HF or ammonium fluoride (NH$_4$F), by HF vapor treatment, by exposure to hot H$_2$ vapor, or by a hydrogen plasma treatment (e.g., atomic hydrogen).

Figure 1C:
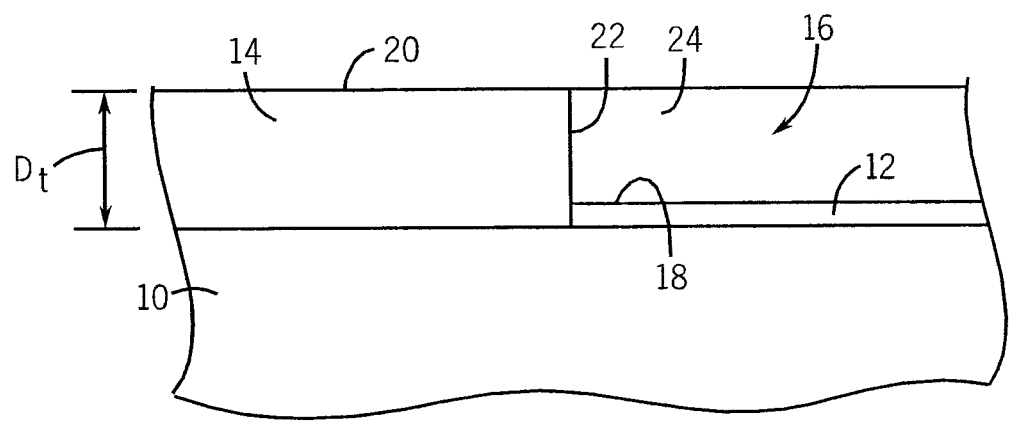

Referring now to FIG. 1C, in another embodiment, the material layer 14 can be formed on the substrate 10 and etched to form the trenches 16, and the neutral wetting material 12 then applied to the floors 18 of the trenches 16. For example, floors 18 of the trenches 16 that are neutral wetting to PS-b-PMMA can be prepared by spin-coating PS-r-PMMA-r-BCB onto the surface of the substrate 10 within the trenches 16 and thermally cross-linking the polymer (e.g., at 190°, for 4 hours) to form a cross-linked polymer mat as neutral wetting layer 12. Capillary forces pull the random copolymer to the bottom of deep trenches. Non-cross-linked polymer material can be subsequently removed.

The sidewalls 22 of the trenches 16 are preferential wetting by one block of the copolymer to induce formation of lamellae as the blocks self-assemble. The material layer 14 defining the surfaces of trenches 16 can be an inherently preferential wetting material, or in other embodiments, a layer of a preferential wetting material can be applied onto the surfaces of the trenches 16.

For example, in the use of poly(styrene-block-methyl methacrylate) (PS-b-PMMA), an oxide (e.g., silicon oxide, $SiO_x$) or a clean silicon surface (with native silicon oxide) exhibits preferential wetting toward the PMMA block to result in the assembly of a thin (e.g., ¼ pitch) interface layer of PMMA and alternating PMMA and PS lamellae (e.g., ½ pitch) within each trench in the use of a lamellar-phase block copolymer material. Other preferential wetting surfaces to PMMA can be provided, for example, by silicon nitride, silicon oxycarbide, polymethylmethacrylate (PMMA) polymer grafted to a sidewall material such as silicon oxide, and resist materials such as methacrylate-based resists. For example, a PMMA that is modified with a moiety containing one or more hydroxyl (—OH) groups (e.g., hydroxyethylmethacrylate) can be applied by spin coating and then heated (e.g., to about 170° C.) to allow the OH groups to end-graft to the oxide sidewalls 22 and ends 24 of the trenches 16. Non-grafted material can be removed from the neutral wetting layer 12 by rinsing with an appropriate solvent (e.g., toluene). See, for example, Mansky et al., *Science*, 1997, 275, 1458-1460, and In et al., *Langmuir*, 2006, 22, 7855-7860, the disclosures of which are incorporated by reference herein.

Figure 1D:
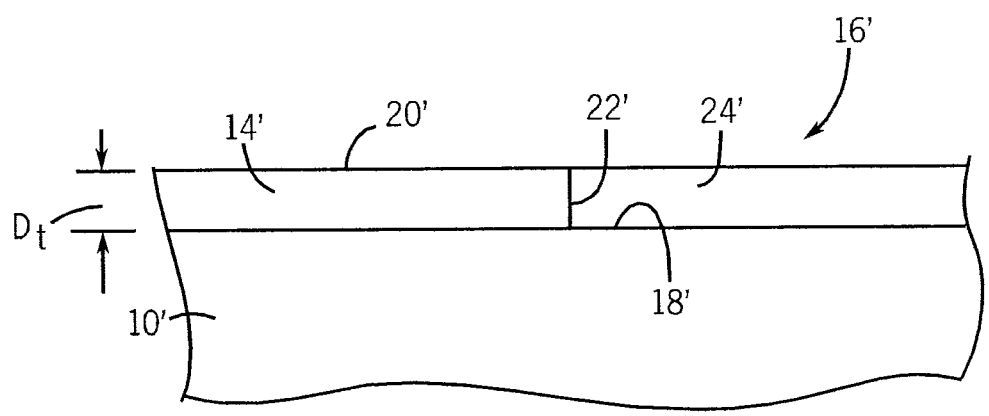
FIG. 1D is an elevational, cross-sectional view of a substrate used in another embodiment of the invention.

Referring now to FIG. 1D, in other embodiments using a cylindrical-phase block copolymer to form a base polymer film within trenches, the surfaces of the floor 18', sidewalls 22' and the ends 24' of the trenches 16' are preferential wetting by the minority block of the copolymer to induce formation of parallel lines of half-cylinders wetting an air interface (surface exposed) down the middle of each trench 16' aligned parallel to the sidewalls 22' and floor 18' of the trenches 16'. For example, substrate 10' can be composed of an inherently preferential wetting material such as a clean silicon surface (with native silicon oxide) and material layer 14' can be composed of oxide (e.g., $SiO_x$). Both materials exhibit preferential wetting toward the PMMA block to result in an assembly of a thin interface layer of PMMA on the sidewalls 22' of the trenches 16', as well as PMMA cylinders in the center of a PS matrix within each trench 16'. Other preferential wetting surfaces to PMMA can be provided, for example, by silicon nitride, silicon oxycarbide, and PMMA polymer grafted to a sidewall material such as silicon oxide, and resist materials such as methacrylate-based resists. See, for example, C. T. Black and O. Bezencenet, "Nanometer-Scale Pattern Registration and Alignment by Directed Diblock Copolymer Self-Assembly," *IEEE Transactions on Nanotechnology*, 2004, 3(3), 412-415; C. T. Black, "Self-Aligned Self-Assembly of Multi-Nanowire Silicon Field Effect Transistors," *Applied Physics Letters*, 2005, 87, 163116; R. Ruiz, R. L. Sandstrom and C. T. Black, "Induced Orientational Order in Symmetric Diblock Copolymer Thin-Films," *Advanced Materials*, 2007, 19(4), 587-591, the disclosures of each of which are hereby incorporated by reference herein.

The sidewalls, edges and floors of the trenches influence the structuring of the array of nanostructures within the trenches. The boundary conditions of the sidewalls of the trenches in both the x- and y-axis impose a structure wherein each trench contains n number of features (i.e., cylinders or lamellae). Factors in forming a single array or layer of nanostructures within the trenches include the width and depth of the trench, the formulation of the block copolymer to achieve the desired pitch ($L_o$), and the thickness (t) of the copolymer film.

The trenches 16 are constructed with a width ($w_t$) such that a block copolymer (or blend) will self-assemble upon annealing into a single layer of "n" structures spanning the width ($w_t$) of the trench 16, with each structure (i.e., cylinders or lamellae) being separated by a value of $L_o$ (from center-to-center). The width ($w_t$) of the trenches 16 is a multiple of the inherent pitch value ($L_o$) of the polymer being equal to or about $nL_o$ ("n*$L_o$"), typically ranging from about n*10 to about n*100 nm (with n being the number of features or structures). In embodiments of the invention, the depth ($D_t$) of the trenches 16 is greater than or at about $L_o$ in using a lamellar-phase block copolymer for the base layer (FIGS. 1B and 1C), and less than $L_o$ in using a cylindrical-phase block copolymer (e.g., trench 16' as depicted in FIG. 1D). The application and annealing of a block copolymer material having an inherent pitch value of $L_o$ in a trench having a width ($w_t$) at or about $L_o$, will result in the formation of a single layer of "n" structures spanning the width and registered to the sidewalls for the length of the trench. In some embodiments, the trench dimension is about 50 nm to 500 nm wide ($w_t$) and about 1,000 µm to 10,000 µm in length ($l_t$), with a depth ($D_t$) of about 50 nm to 500 nm in using a lamellar-forming block copolymer, and about 50 nm to 2000 nm wide ($w_t$) with a depth ($D_t$) of about 15 nm to 25 nm in using a cylinder-forming block copolymer. The width ($w_s$) of the spacer or crest 20 between adjacent trenches is at or about an integral multiple of $L_o$ such that as the film situated on the crest 20 is annealed, the expanding registered fronts will be matched and aligned where they converge. The spacer width ($w_s$) can vary from about the width ($w_t$) of the trench 16 to up to about 10× to 20× the trench width.

The trenches 16, 16' can be formed using a lithographic tool having an exposure system capable of patterning at the scale of $L_o$ (10 nm to 100 nm). Such exposure systems include, for example, extreme ultraviolet (EUV) lithography, proximity X-rays, and electron beam (e-beam) lithography, as known and used in the art. Conventional photolithography can attain (at smallest) about 58 nm features.

Figure 2A:
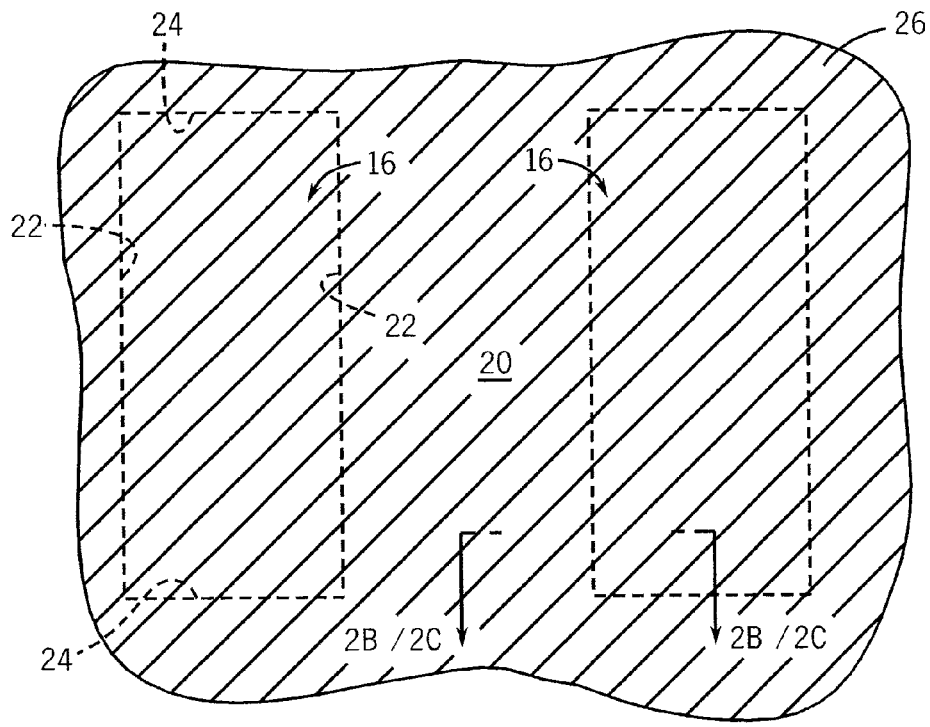
Figure 2B:
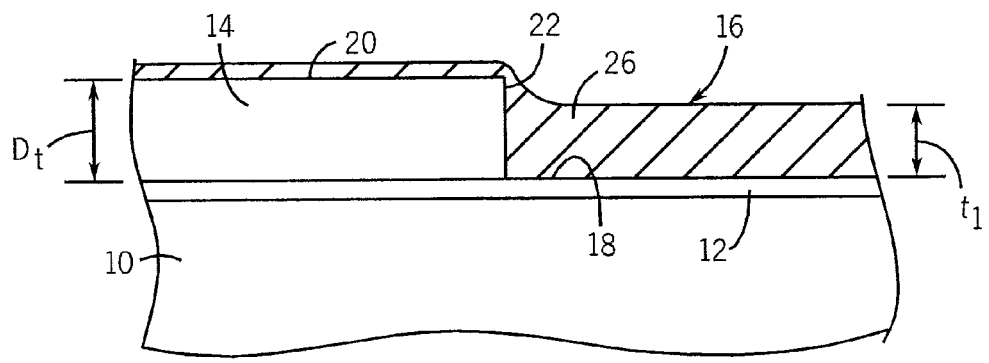
Figure 2C:
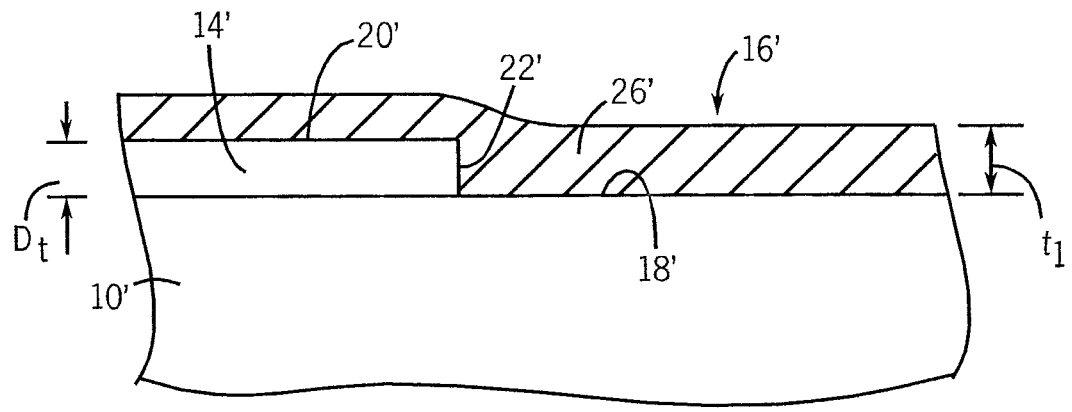

Referring now to FIGS. 2A-2C, a self-assembling (SA) block copolymer material 26, 26' having an inherent pitch at or about $L_o$ (or a ternary blend of block copolymer and homopolymers blended to have a pitch at or about $L_o$) is then deposited, typically by spin casting (spin-coating), onto the floor 18, 18' of the trenches 16, 16'. The block copolymer material 26, 26' can be deposited onto a patterned surface by spin casting from a dilute solution (e.g., about 0.25 wt % to 2 wt % solution) of the copolymer in an organic solvent such as dichloroethane ($CH_2Cl_2$) or toluene, for example.

As illustrated in FIG. 2B, in embodiments using a lamellar-phase block copolymer for the base layer, with a trench depth ($D_t$) of greater than or at about $L_o$, a layer of the first block copolymer material 26 is deposited into the trenches 16 to a thickness ($t_1$) less than the trench depth ($D_t$), for example, at about one-half of the trench depth, and at or about the $L_o$ value of the block copolymer material 26 such that a copolymer film layer will self-assemble upon annealing to form a single layer of lamellae across the width ($w_t$) of the trench 16.

As shown in FIG. 2C, in embodiments using a cylindrical-phase block copolymer for the base layer, with a trench depth ($D_t$) less than $L_o$, a layer of the first block copolymer material 26' is deposited into the trenches 16' to a thickness ($t_f$) greater than the trench depth ($D_t$), but less than $L_o$ such that the copolymer film layer will self-assemble upon annealing to form a single layer of parallel lines of half-cylinders across the width ($w_t$) of the trench.

A typical thickness ($t_f$) of a lamellar-phase block copolymer film 26 is about ∀ 20% of the $L_o$ value of the polymer (e.g., about 10 nm to 100 nm) to form, for example, alternating polymer-rich lamellar blocks having a width of about $L_o$ (e.g., 25 nm to 35 nm). The thickness ($t_f$) of a cylindrical-phase block copolymer film 26 is less than $L_o$ to form parallel-oriented half-cylinders of one block having a diameter of about $L_o$ in a matrix of another block within each trench 16. The thickness of the copolymer film layer can be measured, for example, by ellipsometry techniques.

Although diblock copolymers are used in the illustrative embodiments, other types of block copolymers (i.e., triblock or multiblock copolymers) can be used. Examples of diblock copolymers include poly(styrene-block-methyl methacrylate) (PS-b-PMMA), polyethyleneoxide-polyisoprene, polyethyleneoxide-polybutadiene, polyethyleneoxide-polystyrene, polyethyleneoxide-polymethylmethacrylate, polystyrene-polyvinylpyridine, polystyrene-polyisoprene (PS-b-PI), polystyrene-polybutadiene, polybutadiene-polyvinylpyridine, and polyisoprene-polymethylmethacrylate, among others. Examples of triblock copolymers include poly (styrene-block methyl methacrylate-block-ethylene oxide). One of the polymer blocks of the block copolymer should be selectively and readily removable in order to fabricate an etch mask or template from the annealed film.

In embodiments in which the base or template layer is formed from a lamellar-forming diblock copolymer, the volume fractions of the two blocks (AB) are generally at a ratio between about 50:50 and 60:40. An example of a lamellae-forming symmetric diblock copolymer is PS-b-PMMA with a weight ratio of about 50:50 (PS:PMMA) and total molecular weight ($M_n$) of about 51 kg/mol.

In other embodiments in which the base layer is formed using a cylindrical-phase diblock copolymer, the volume fractions of the two blocks (AB) are generally at a ratio between about 60:40 and 80:20. An example of a cylindrical phase diblock copolymer material is PS-b-PMMA ($L_o$=35 nm) composed of about 70% PS and 30% PMMA (weight ratio of 70:30) with a total molecular weight ($M_n$) of 67 kg/mol to form about 20 nm diameter half-cylinder PMMA domains in a matrix of PS. To achieve an annealed base film in which the half-cylinders or lamellae are surface exposed, the Chi value of the polymer blocks (e.g., PS and PMMA) at common annealing temperatures is generally small such that an air interface is equally or non-selectively wetting to both blocks.

The block copolymer material can also be formulated as a binary or ternary blend comprising an SA block copolymer and one or more homopolymers of the same type of polymers as the polymer blocks in the block copolymer, to produce blends that swell the size of the polymer domains and increase the $L_o$ value of the polymer. The volume fraction of the homopolymers can range from 0% to about 40%. An example of a ternary diblock copolymer blend is a PS-b-PMMA/PS/PMMA blend, for example, 46K/21K PS-b-PMMA containing 40% 20K polystyrene and 20K poly(methylmethacrylate). The $L_o$ value of the polymer can also be modified by adjusting the molecular weight of the block copolymer, e.g., for lamellae, $L_o \sim (MW)^{2/3}$.

Optionally, ellipticity ("bulging") can be induced in the structures by creating a slight mismatch between the trench and the spacer widths and the inherent pitch ($L_o$) of the block copolymer or ternary blend, as described, for example, by Cheng et al., "Self-assembled One-Dimensional Nanostructure Arrays," *Nano Lett.*, 2006, 6(9), 2099-2103, the disclosure of which is incorporated by reference herein, which then reduces the stresses that result from such mismatches.

Figure 3C:
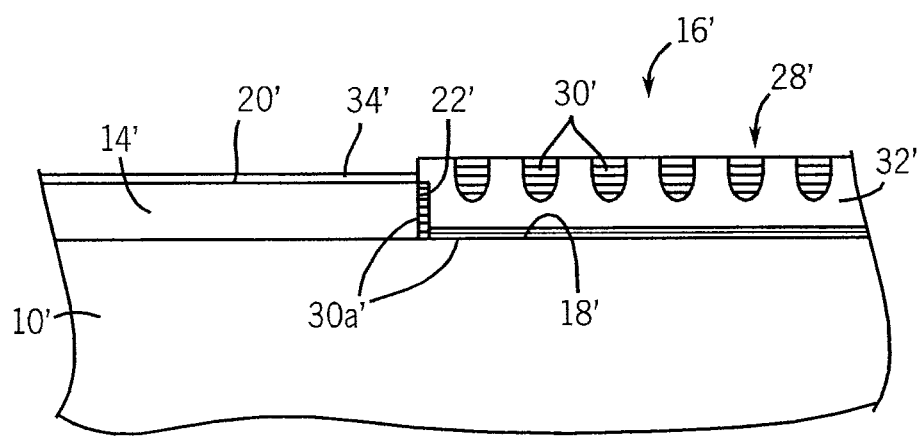
Figure 3A:
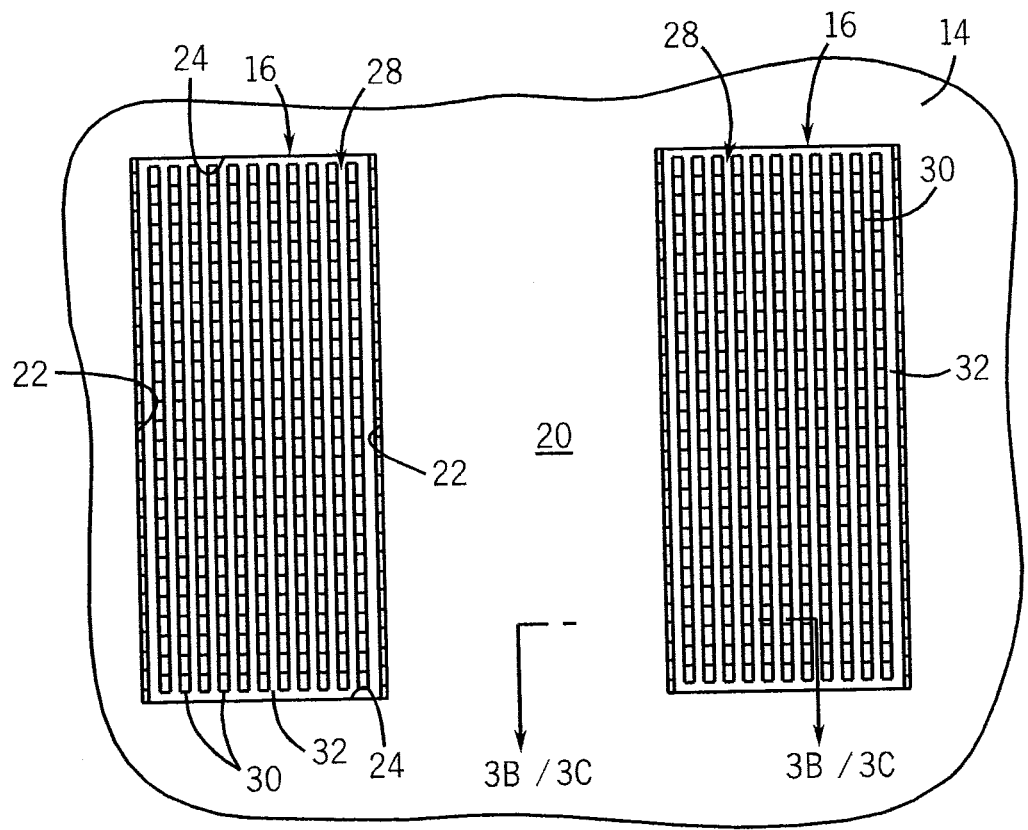
Figure 3B:
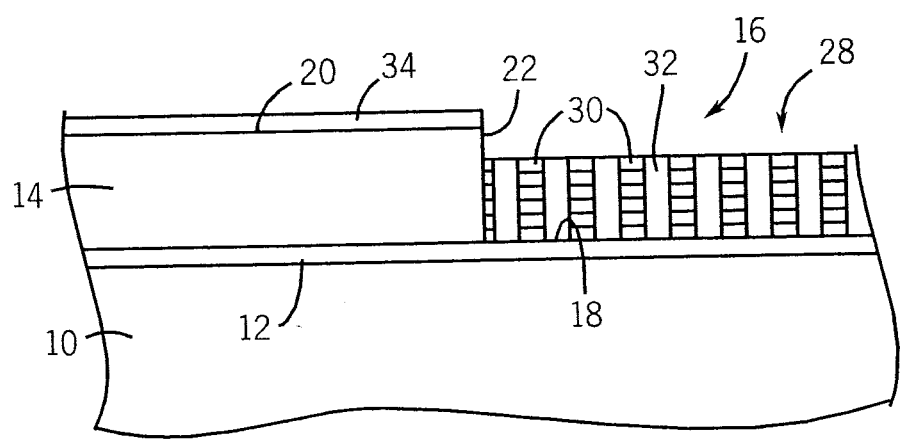

Referring now to FIGS. 3A-3C, the first block copolymer film 26 is then annealed, for example, by thermal annealing to above the glass transition temperature of the component blocks of the copolymer material to cause the polymer blocks to separate and self-assemble according to the preferential and neutral wetting of the trench surfaces 16, 18, 22, to form a self-assembled block copolymer structure 28. For example, a PS-b-PMMA copolymer film can be annealed at a temperature of about 180° C. to 195° C. in a vacuum oven (not shown) for about 1 to 24 hours to achieve the self-assembled morphology. The film can also be solvent annealed, for example, by slowly swelling both blocks of the film with a solvent, then slowly evaporating the solvent.

The constraints provided by the width ($w_t$) of the trenches and the character of the copolymer composition combined with preferential or neutral wetting surfaces within the trenches results, upon annealing, in a single layer of n elements across the width ($w_t$) of the trench. The number "n" or pitches of elements (e.g., lamellar blocks or half-cylinders) within a trench is according to the width ($w_t$) of the trench and the molecular weight (MW) of the block copolymer.

For example, as shown in FIG. 3B, a lamellar-phase block copolymer material used to form the base layer 28 will, upon annealing, self-assemble into perpendicular-oriented, alternating polymer-rich blocks 30, 32 spanning the width ($w_t$) of the trench 16 at an average pitch value at or about $L_o$. For example, depositing and annealing an about 50:50 PS:PMMA block copolymer film ($M_n$=51 kg/mol; $L_o$=nm) in an about 250 nm wide trench will subdivide the trench into about eight (8) lamellar structures.

In another embodiment, as illustrated in FIG. 3C, annealing of a cylindrical-phase copolymer material to form the base layer 28' will result in parallel-oriented half-cylinders 30' within a polymer matrix 32' spanning the width of the trench 16', with each half-cylinder 30' being separated by an average value of at or about $L_o$, and an interface layer 30a' along the sidewalls 22' and the floor 18'. For example, depositing and annealing a 70:30 PS:PMMA block copolymer film ($M_n$=67 kg/mol; $L_o$=35 nm) in an about 250 nm wide trench will subdivide the trench into about seven (7) half-cylinder structures.

The resulting morphologies of the annealed base film 28, 28' (i.e., perpendicular orientation of lamellae or parallel orientation of half-cylinders 30') can be examined, for example, using atomic force microscopy (AFM), transmission electron microscopy (TEM), or scanning electron microscopy (SEM).

The annealed and ordered base film 28, 28' is then treated to cross-link the polymer segments to fix and enhance the strength of the self-assembled polymer blocks 30, 32 and 30', 32' within the trenches 16, 16' (e.g., to cross-link the PS segments). The polymers can be structured to inherently cross-link (e.g., upon UV exposure), or one or both of the polymer blocks of the copolymer material can be formulated to contain a cross-linking agent.

For example, in one embodiment, the trench regions can selectively be exposed through a reticle to cross-link only the self-assembled film 28, 28' within the trenches 16, 16'. A wash can then be applied with an appropriate solvent such as toluene, to remove the non-cross-linked portions of the film 28, 28' (e.g., on the spacer or crest 20, 20') leaving the registered self-assembled base film within the trenches 16, 16' and exposing the surface of material layer 14, 14' above/outside the trenches 16, 16' (e.g., the crest 20, 20'). As shown in FIGS. 3B and 3C, a neutral wetting layer 34, 34' can then be formed on the exposed surface of the material layer 14, 14' (e.g., oxide), for example, by applying and grafting or cross-linking a random copolymer brush layer (e.g., PS-r-PMMA) on the surface.

In another embodiment, the entire annealed film 28, 28' can be cross-linked globally. A photoresist layer can be applied to pattern and expose the areas of the film outside the trench regions (e.g., over the crests 20, 20'), and the exposed portions of the film 28, 28' can be removed, for example, by an oxygen ($O_2$) plasma treatment. The photoresist can then be removed (e.g., stripped). A neutral wetting film can then be formed on the exposed portions of the material layer 14, 14' above the regions of the trench 16, 16' (e.g., the crests 20, 20'). In other embodiments, a film of a photo-cross-linkable, neutral wetting random copolymer can be globally applied (e.g., cast) and photoexposed through a reticle to selectively cross-link the neutral wetting film only over the portions of the material layer 14, 14' above the trenches 16, 16' (e.g., the crests 20, 20'). Non-grafted or non-cross-linked portions of the neutral wetting film (e.g., within the trenches 16, 16') can then be removed, for example, by a solvent rinse (e.g., toluene). See, for example, Hawker et al., "Improving the Manufacturability and Structural Control of Block Copolymer Lithography," Abstracts of Papers, 232nd ACS National Meeting, San Francisco, Calif., Sep. 10-14, 2006, the disclosure of which is incorporated by reference herein.

Figure 4A:
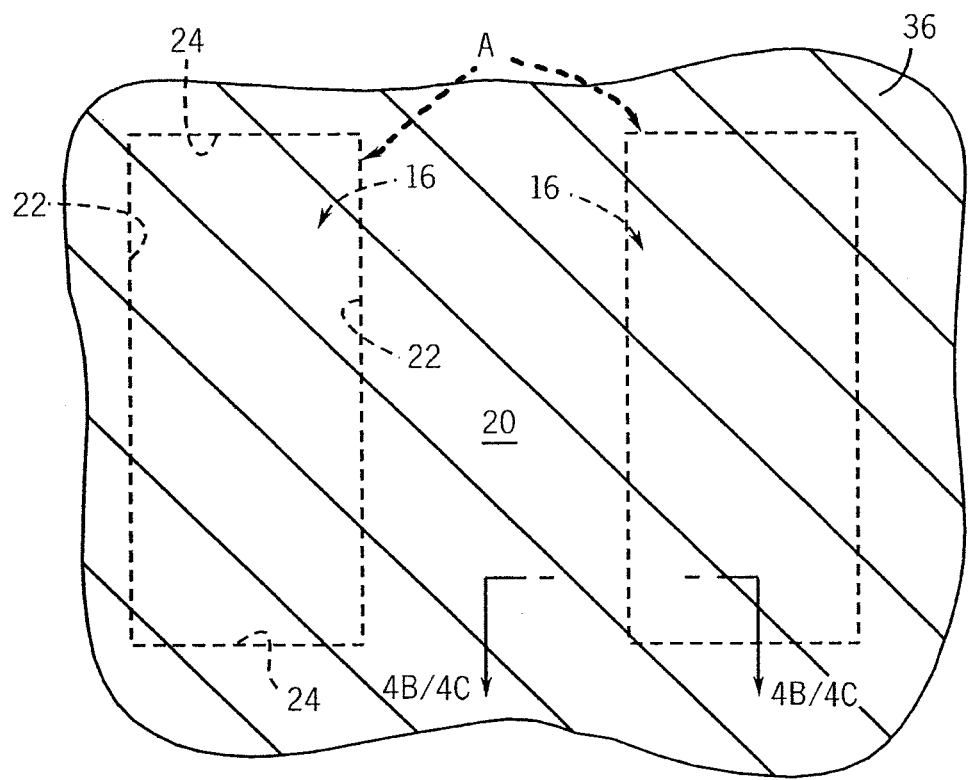
Figure 4B:
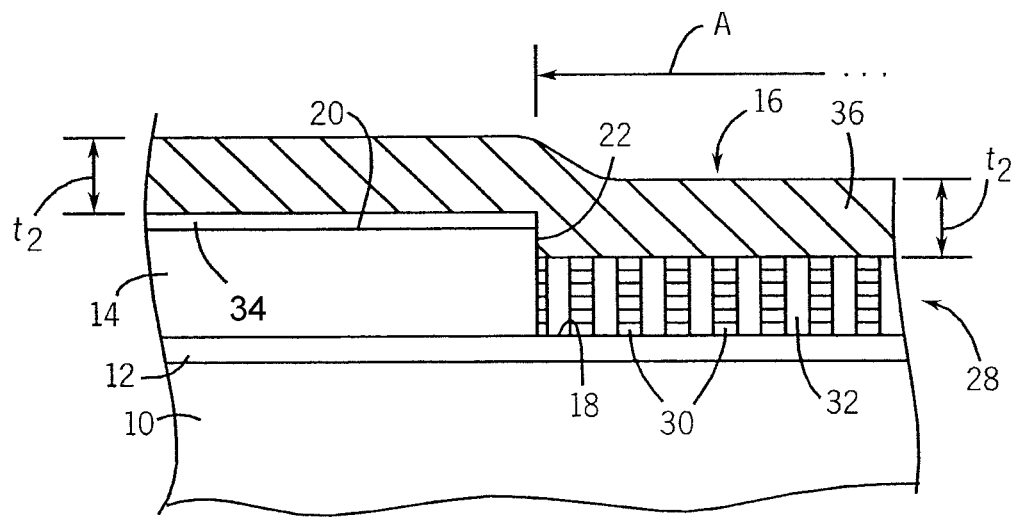
Figure 4C:
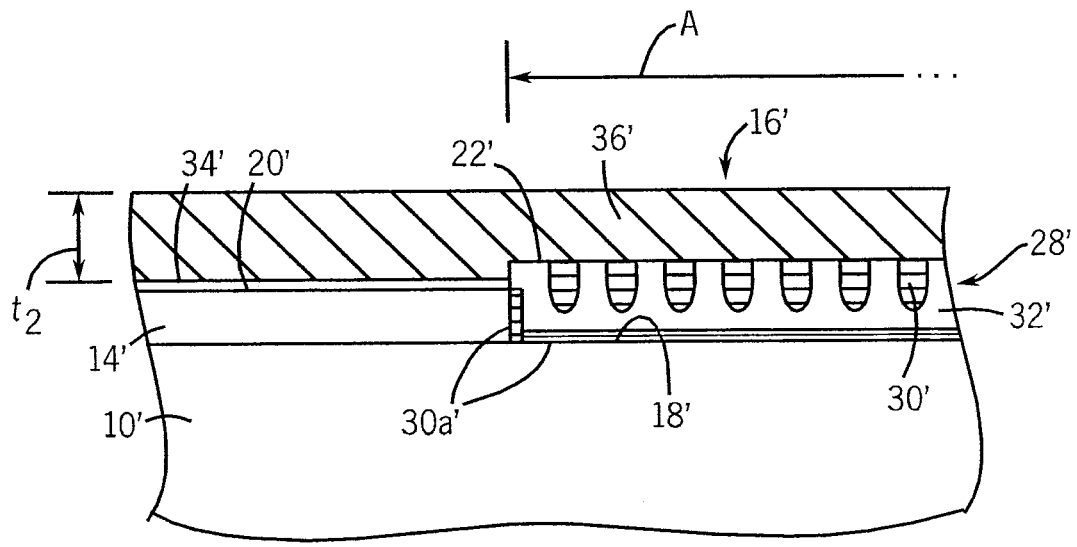

Referring now to FIGS. 4A-4C, a layer of a lamellar-phase block copolymer material 36 having an inherent pitch at or about $L_o$ (or a ternary blend of block copolymer and homopolymers blended to have a pitch at or about $L_o$) is then deposited (e.g., by spin casting) onto the annealed and cross-linked base film 28 within the trenches 16 and onto the neutral wetting layer 34 overlying the material layer 14 (e.g., crest 20) outside the trenches 16. The copolymer material 36 can be spin cast, for example, from a dilute solution of the copolymer in an organic solvent (e.g., about 0.25 wt % to 2 wt % solution).

The lamellar-phase block copolymer layer 36 is cast over the neutral wetting layer 34, 34' (e.g., over crest 20) and the base film 28 within the trenches 16 to a thickness ($t_2$) at or about the $L_o$ value of the block copolymer material 36 such that, upon annealing, the copolymer film layer 36 will self-assemble to form a single layer of perpendicular-oriented lamellar domains each having a width ($w_2$) of about $L_o$.

Figure 5C:
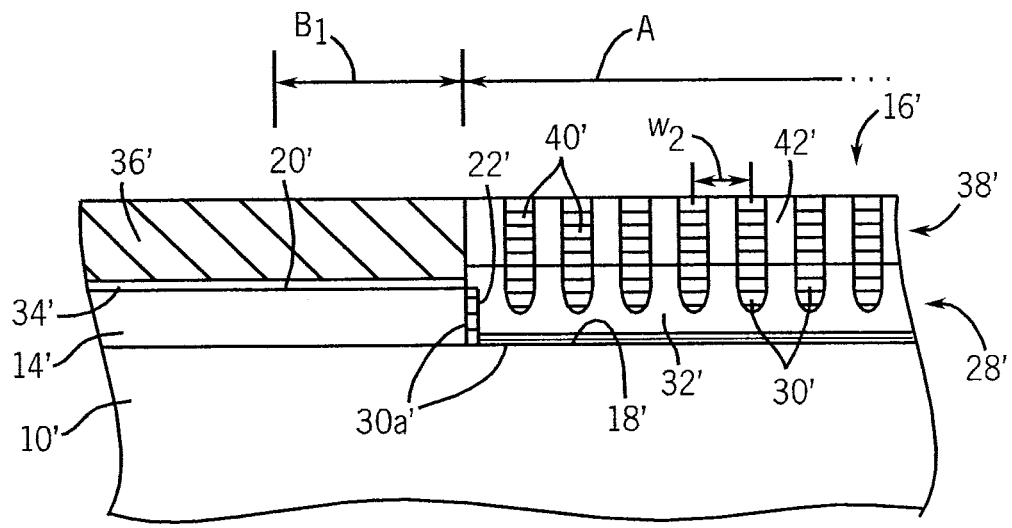
Figure 5A:
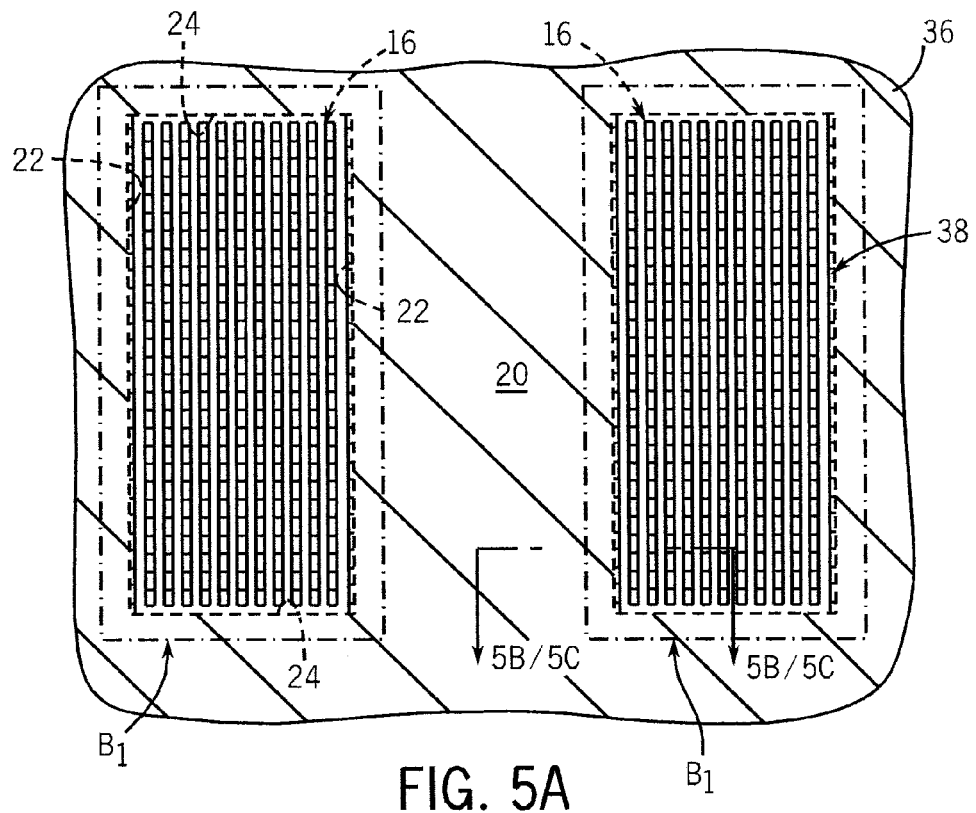
Figure 5B:
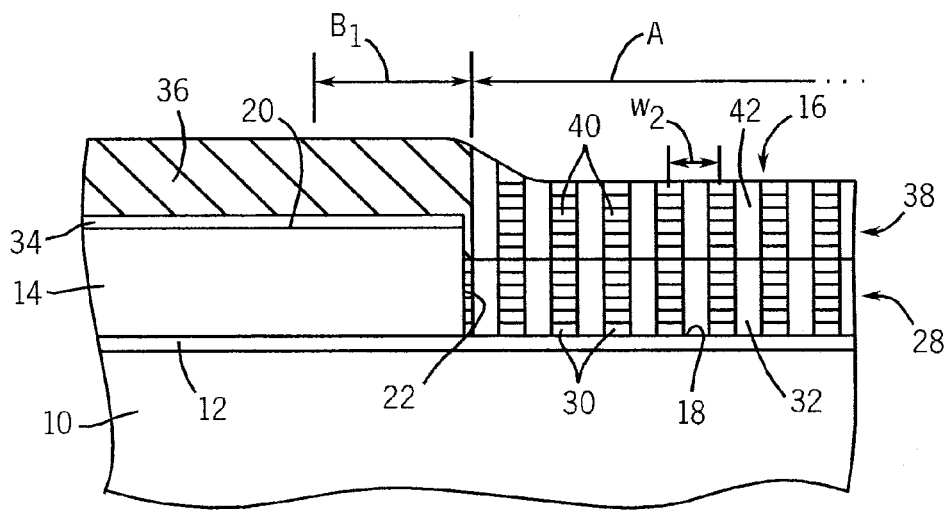

As shown in FIGS. 5A-5C, annealing of the lamellar-phase block copolymer layer 36 is then conducted to cause the polymer blocks to separate and self-assemble into a film 38, 38' composed of perpendicular-oriented lamellar-phase domains 40, 42 and 40', 42' in a striped pattern, for example, at about 180° C. to 195° C. for a PS-b-PMMA copolymer film. An annealing process is performed to achieve ordering of the lamellar blocks across plateaus or crests 20, 20' between the trenches 16, 16' and other areas of the substrate 10, 10' that are without constraints or defined features or boundaries (e.g., sidewalls 22, 22' and/or edges 24, 24' of trenches 16, 16') to which self-assembling copolymer blocks can align.

Current methods for annealing a block copolymer film to cause microphase separation of the polymer blocks involve placing the film-coated substrate into a vacuum oven and heating the entire film globally and simultaneously at a single set temperature and time period. However, while global heating may produce a film that is ordered and registered within the trenches, on areas of the substrate beyond the confines of the trenches that lack constraints or topographic features to which the copolymer film can self-align or that will drive the self-assembling blocks in a set direction, the block copolymer film will self-assemble into randomly ordered structures in a meandering fingerprint-type configuration. See, for example, R. Ruiz, R. L. Sandstrom and C. T. Black, "Induced Orientational Order in Symmetric Diblock Copolymer Thin-Films," *Advanced Materials*, 2007, 19(4), 587-591. That layout and the lack of ordering of repeat structures make the film unusable for most templating applications.

Rather than performing a global heating of the film, embodiments of the invention utilize techniques for performing an anneal of the copolymer film by a localized application of thermal energy to portions of the polymer film that have registry to them.

With reference to FIGS. 4A-4C, initially, a limited area of the lamellar-forming film 36, 36' over and above the trenches 16, 16', region "A" shown as dashed line "A" in FIG. 4A, is selectively heated to cause self-assembly of the polymer domains and produce ordered lamellar domains that are registered to the underlying base film 28, 28' within the trenches 16, 16'. During the anneal, the base film 28, 28' imposes an induced ordering effect on the overlying self-assembling lamellar film 36, 36' to reproduce the underlying pattern of the base film 28, 28'. Intrinsic periods of the two block copolymer materials 26, 36 and 26', 36' can be matched, for example, through a ternary blend of either or both of the copolymer materials 26, 36 and 26', 36' with one or more homopolymers to adjust the polymer periods ($L_o$ values). See, for example, R. Ruiz, R. L. Sandstrom and C. T. Black, "Induced Orientational Order in Symmetric Diblock Copolymer Thin-Films," *Advanced Materials*, 2007, 19(4), 587-591, the disclosure of which is incorporated by reference herein.

As illustrated in FIGS. 5A-5C, this initial anneal results in the formation of a single layer 38, 38' of assembled and ordered, perpendicular-oriented lamellar domains 40, 42 and 40', 42' that are registered to the underlying assembled domains of the base film 28, 28' within the trenches 16, 16', i.e., the lamellar domains 30, 32 and 30', 32' (FIG. 5B) or the half-cylinders 30' and matrix domains 32' (FIG. 5C) of the base film 28, 28' within the trenches 16, 16'. The annealed copolymer layer 38, 38' comprises alternating stripes of the two components of the lamellar-phase block copolymer. Only those portions of the copolymer film 36, 36' that are heated above the glass transition temperature of the component polymer blocks will self-assemble, and areas of the copolymer film 36, 36' situated outside of region "A" that were not sufficiently heated remain as the initially deposited disordered and unassembled block copolymer film 36, 36'. A temperature gradient can be provided across the substrate 10, 10', with the temperature above the glass transition temperature in regions where annealing of the film occurs to produce registered and ordered structures, and below the glass transition temperature in areas outside of those regions.

Figure 6A:
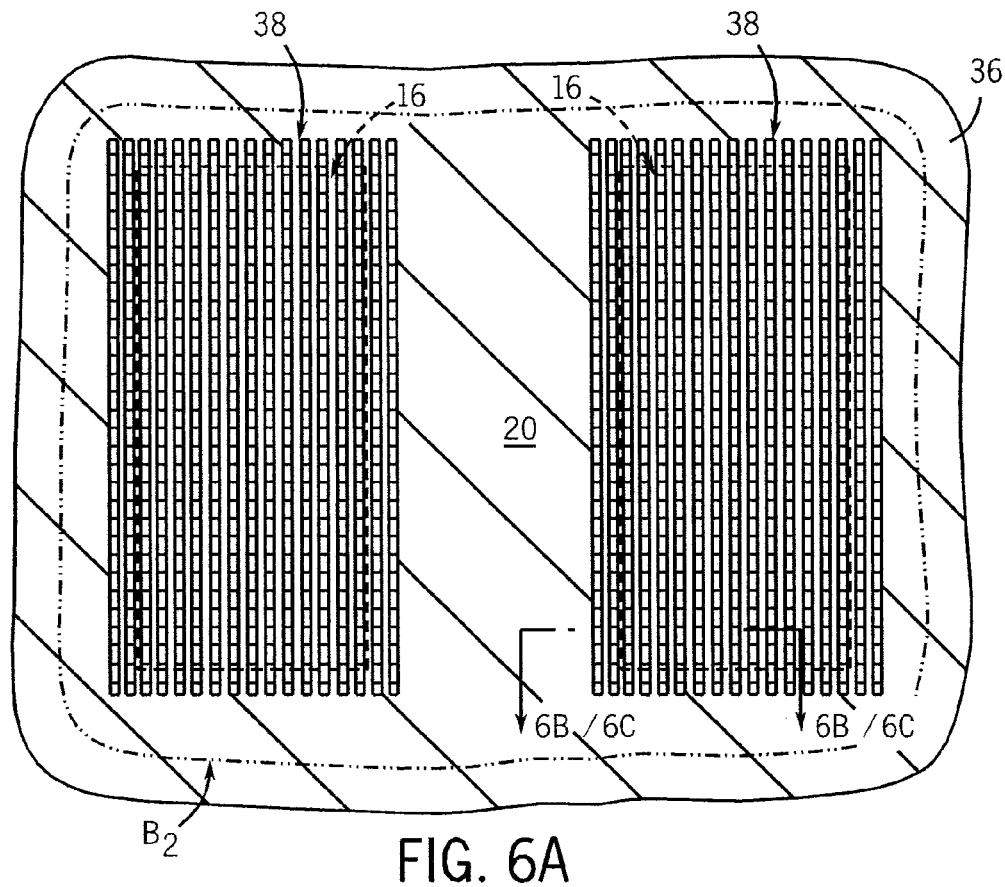
Figure 6B:
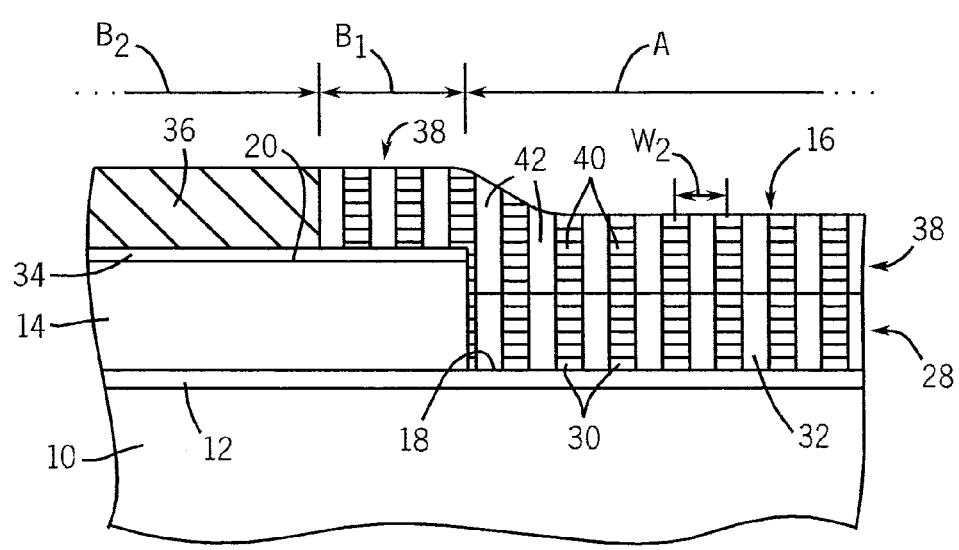
Figure 6C:
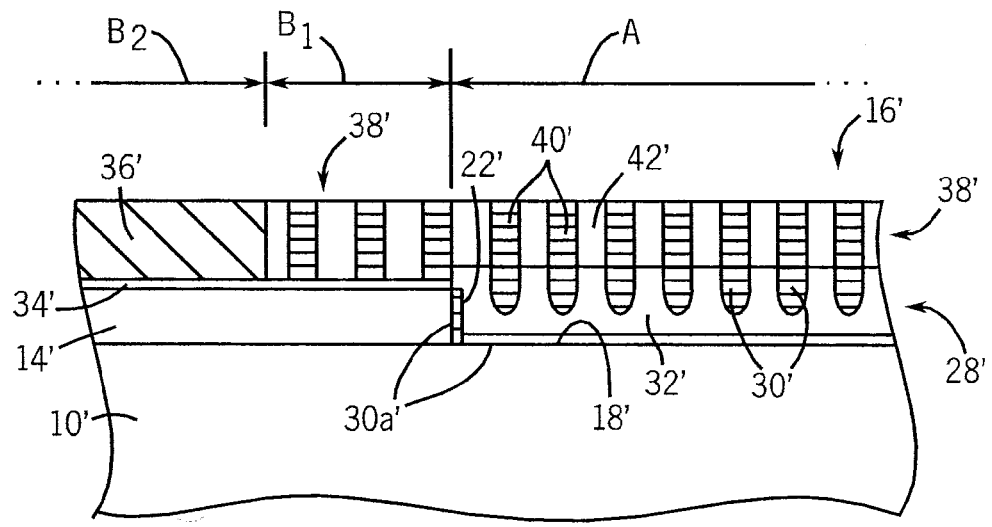

Following the annealing and ordering of the copolymer film 38 within region "A", the zone of thermal heating ("thermal corona") is expanded laterally, using the initially formed self-assembled lamellar structure 38 over the trenches 16 to induce an ordering effect on the adjacently situated unannealed portion of the polymer film 36 beyond the edges 24 of the trenches 16 (region "B$_1$"). In some embodiments, the localized heating of the lamellar-forming film 36 is performed to limit heating to about three through four to six through eight pitches or repeat units, L$_o$, of the copolymer film 30 at a time, e.g., to dashed line of region "B$_1$" in FIGS. 5A-5C. The newly annealed portion of the film (i.e., region "B$_1$") will then self-assemble into perpendicular-oriented lamellar domains in an ordered repeat pattern that matches and is registered to the previously formed adjacent array within region "A", as shown in FIGS. 6A-6C. Once the ordering of lamellae within the annealed zone has been completed, the zone of heating can be further expanded laterally (region "B$_2$") to anneal additional portions of the second block copolymer film adjacent to the previously annealed and ordered portion of the film (i.e., region "B$_1$") to extend the range of ordered structures over the substrate 10 until the desired pattern repeat structure is obtained.

Figure 7A:
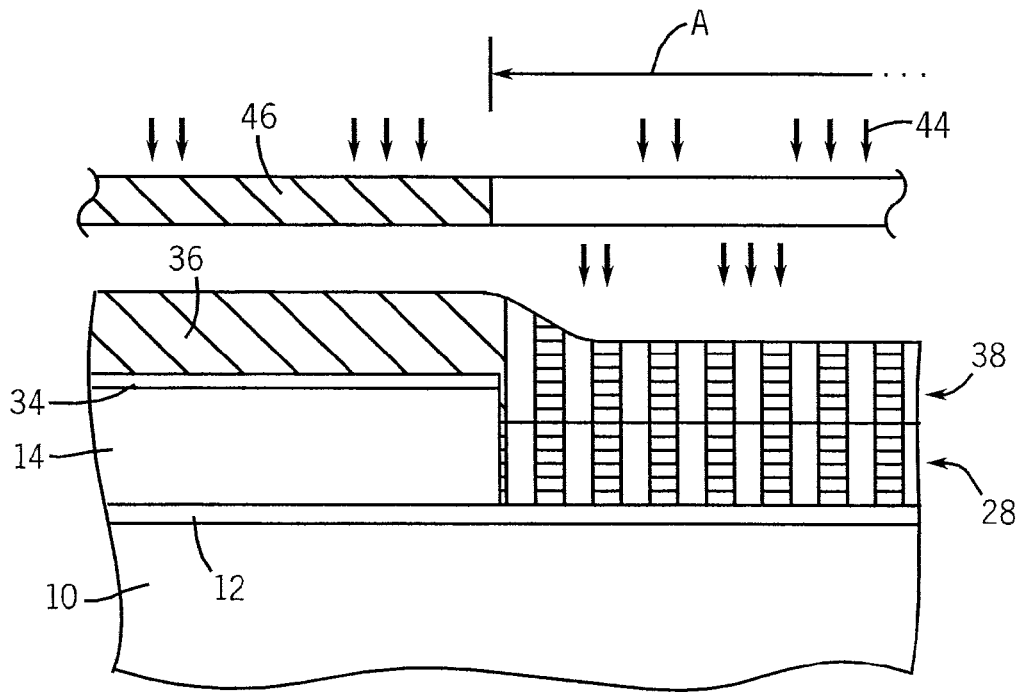
FIGS. 7A and 7B illustrate elevational, cross-sectional views of the substrate depicted in FIG. 5B, showing annealing of a portion of the film at various stages according to an embodiment of the disclosure by use of a laser source illuminated through a mask or reticle.
Figure 7B:
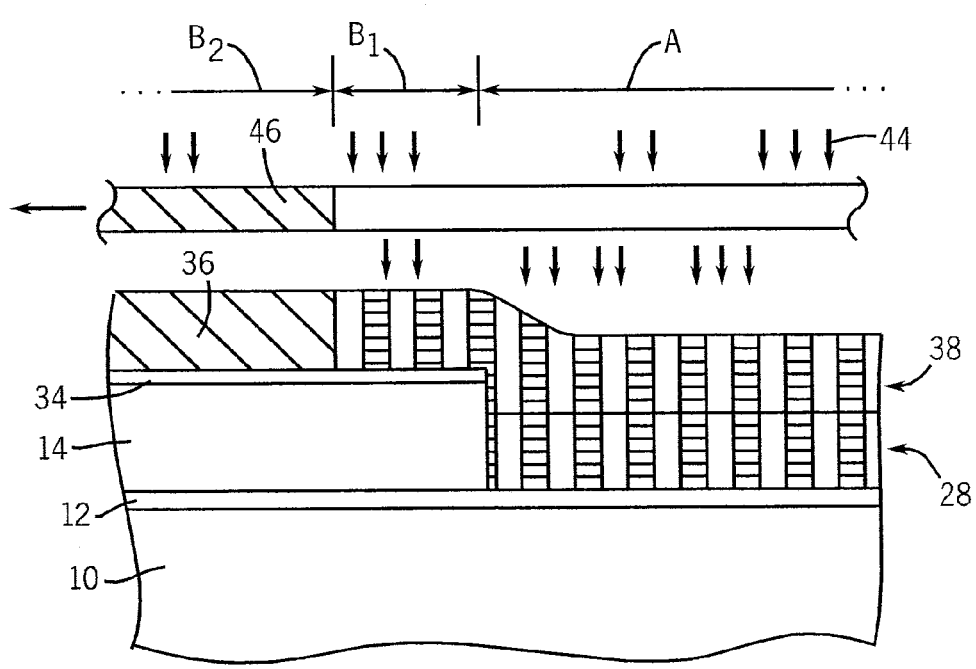

In one embodiment, depicted in FIGS. 7A and 7B, annealing of the lamellar-phase block copolymer layer 36 is accomplished by focused and localized thermal heating of a targeted area (e.g., region "A") by directing a laser source 44 of short-UV wavelength onto the film. The laser source 44 (with adequate power) can be illuminated through a mask (or reticle) 46 or masking elements associated with a laser beam apparatus that shades all areas except for the trenches or inner portions of the trenches. Where the rate of microphase domain segregation is on the order of heat transfer through the film 36, the sections of the film situated above the ordered cylindrical film within the trenches will self-assemble first and in registry with the pattern of the underlying base film 28. The continued addition of thermal energy radiating laterally from the initially assembled, registered portion of the film 36 (within region "A") can be applied to result in regular, registered self-assembly across the breadth of the lamellar-phase film 36 (regions "B$_1$" as in FIG. 5A). The beam of laser source 44 can also be expanded (e.g., defocused) to widen the area of coverage of the film 36, or step-scanned or sweep-scanned across the substrate 10 (arrow ← in FIG. 7B), with the scanning rate set appropriately. The laser source is applied at appropriate parameters (e.g., wavelength, pulse length, intensity) to anneal the targeted area of the film 36. The anneal can be provided using a pulsed laser source.

Figure 8A:
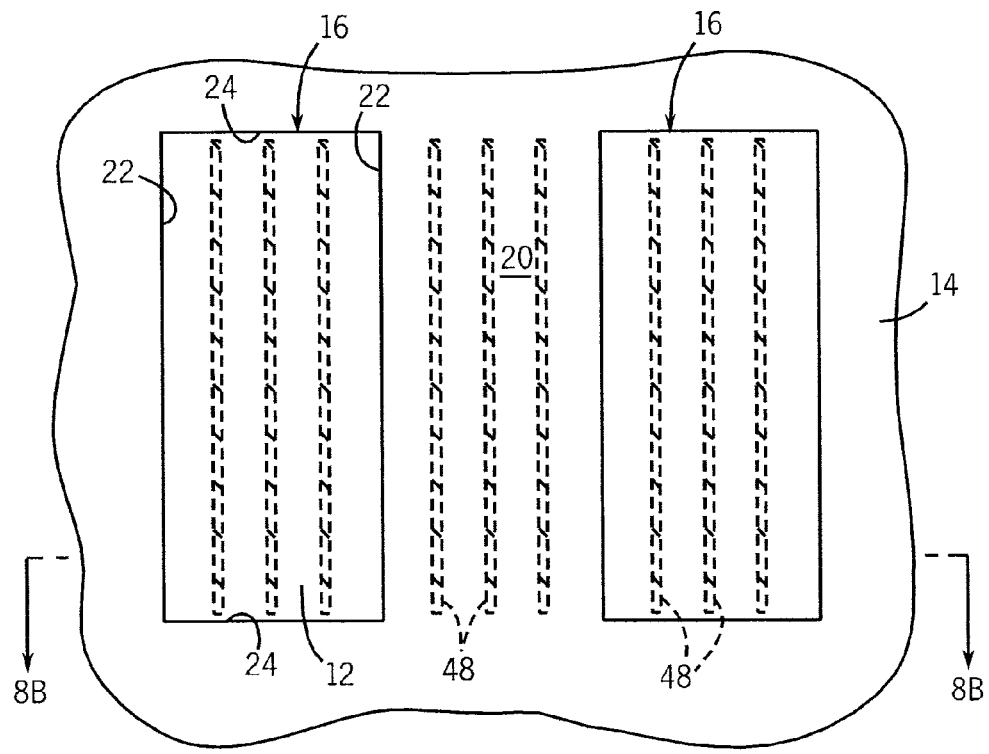
FIG. 8A illustrates a diagrammatic top plan view of the substrate of FIG. 1A, showing an incorporation of thermally conductive lines in the substrate for localized heating of the film layer according to an embodiment of the disclosure.
Figure 8B:
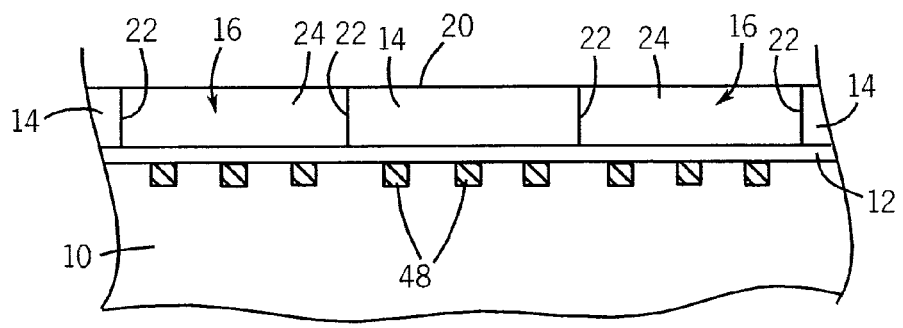
FIG. 8B illustrates an elevational, cross-sectional view of the substrate depicted in FIG. 8A taken along line 8B-8B.

In another embodiment, illustrated in FIGS. 8A and 8B, a series of thin conductive lines 48 of a thermally conductive material (e.g., metal) can be formed in or on the substrate 10 prior to forming the material layer 14. As shown, the conductive lines 48 are provided to extend beneath the trenches 16, and optionally to extend under the material layer 14 beyond the trenches 16. Heat can be generated through the conductive lines 48 to initially anneal the film (see FIGS. 7A and 7B) above the trenches 16, and then to radiate laterally to anneal areas of the film adjacent to the self-assembled film 38 (see FIGS. 7A and 7B) above the trenches 16.

Figure 9:
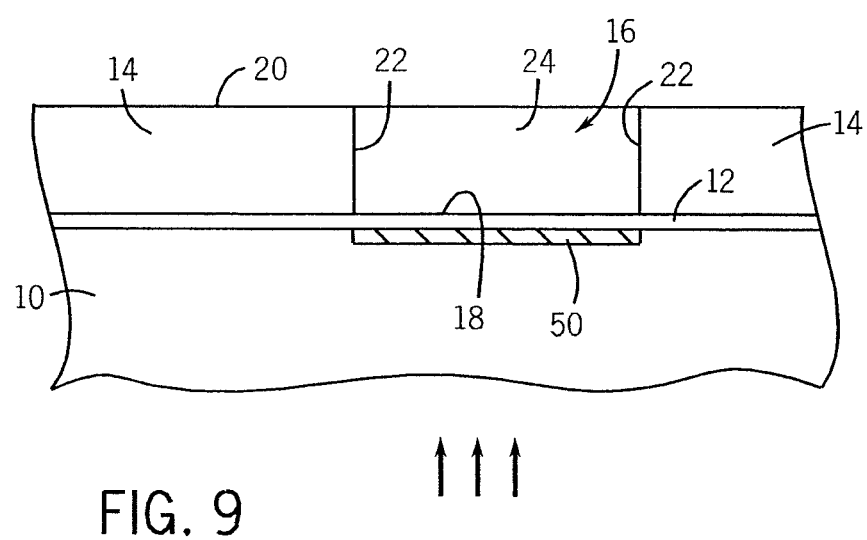
FIG. 9 illustrates an elevational, cross-sectional view of the substrate of FIG. 1A, showing an incorporation of an absorptive material layer for localized heating of the film layer according to another embodiment of the disclosure.
Figure 10A:
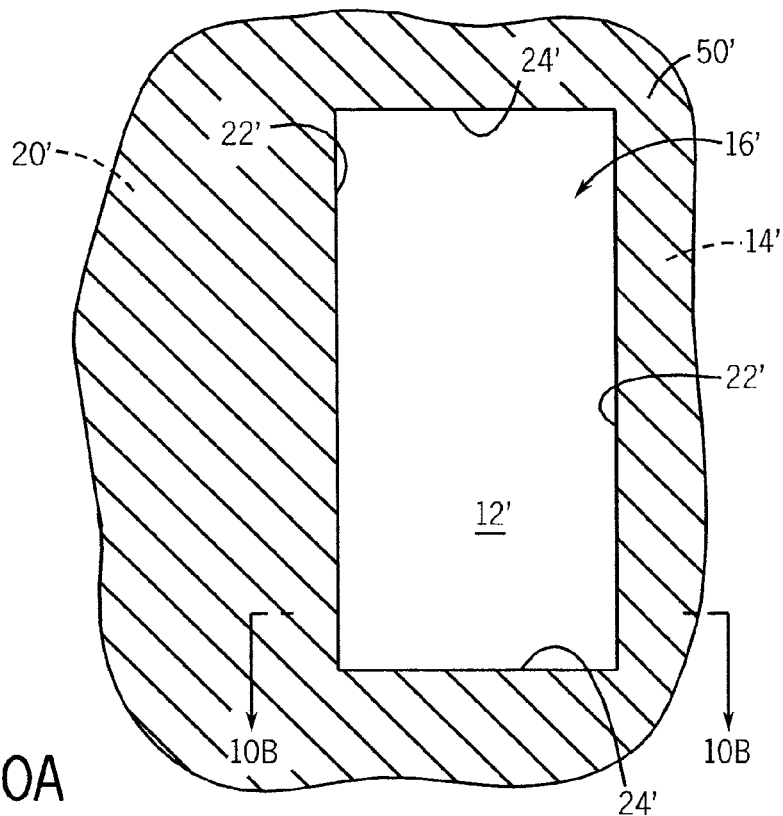
FIG. 10A illustrates a diagrammatic top plan view of the substrate of FIG. 1A, showing an incorporation of a reflective material layer on the exposed surfaces outside of the trenches for localized heating of the film layer according to another embodiment of the disclosure.
Figure 10B:
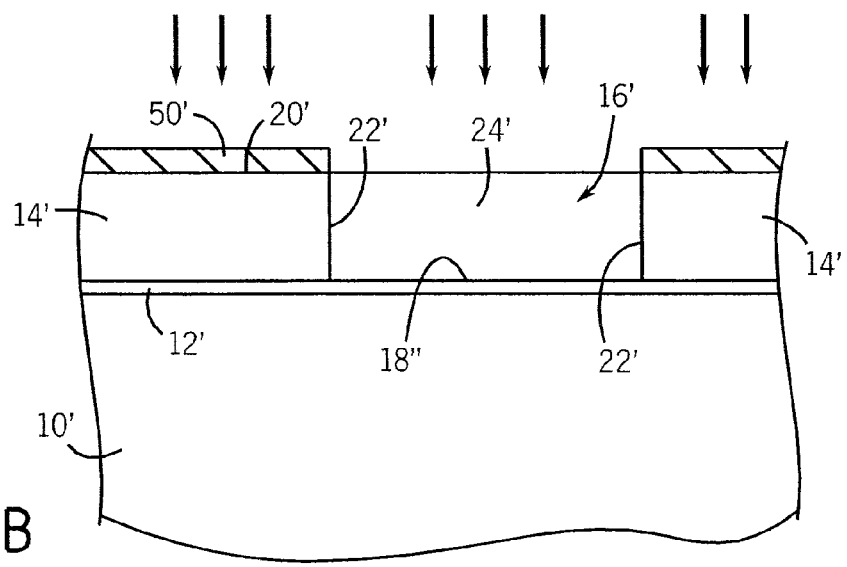
FIG. 10B is an elevational, cross-sectional view of the substrate depicted in FIG. 10A taken along line 10B-10B.

In yet another embodiment, selective localized heating of the lamellar-phase film 36 can be provided by selectively applying an absorptive material layer 50 to substrate 10 prior to depositing the neutral wetting layer 12 and the material layer 14, as shown in the embodiment depicted in FIG. 9, or a reflective material layer 50' to the surface of the material layer 14' outside of the trenches (e.g., the crests 20') as depicted in FIGS. 10A and 10B. Upon application of a radiative heat source (e.g., infrared (IR) heat source or quartz lamp) (arrows ↓), there will be a difference in absorption and/or reflectivity between the area having the reflective or absorptive material layer 50, 50' thereon and those areas that do not, such that localized areas of the film 36 will be heated to above the glass transition temperature while surrounding material will be below that temperature. As lamellae form, the power of the light source can then be slowly increased to expand the area having a temperature above the glass transition temperature, allowing the ordered formation of lamellae along the advancing hot zone. Examples of suitable materials for the absorptive material layer 50 (FIG. 9) include absorptive materials such as silicon carbide and organic infrared (IR) or near-infrared (NIR) absorbers such as Lumogen fluorescent dyes (e.g., Lumogen IR 765 and Lumogen IR 788) (BASF), among others. In other embodiments, the neutral wetting layer 12 can be modified or tailored with absorptive functionality. Examples of suitable materials for layer 50' (FIGS. 10A and 10B) include reflective metals such as aluminum (Al), tungsten (W), chromium (Cr), copper (Cu), ruthenium (Ru), nickel (Ni), among others.

In some embodiments, such as shown in FIG. 9, the backside of the substrate 10 (e.g., wafer) can be heated (arrows ↑) to produce differences in emissivity between the bottom (floor) 18 of trench 16 and the surrounding areas to yield a desired temperature gradient. A coating 50 of a low emissivity material (e.g., a metal such as aluminum, tungsten, etc.) can be applied to the floors 18 of trench 16, which will radiate less heat and maintain a higher temperature than the surrounding area.

In another embodiment, the film 36 can be annealed in a moving temperature gradient (zone annealed). For example, as illustrated in FIG. 11A, the film 36 can be moved across a hot-cold temperature gradient 52a positioned above the film 36 or beneath the substrate 10 (as shown) at a translational set speed (e.g., about 0.05 μm to 10 μm/second) using a motorized translation stage 54 whereupon ordering of nanostructures occurs at the backside as the film 36 re-cools after passing under or over the heat source. In another embodiment shown in FIG. 11B, a heat source can be positioned above the film 36 (e.g., heat source 52b) and/or or beneath the substrate 10 (e.g., heat source 52b') and moved across the film 36 using a motorized mechanism.

Figure 12A:
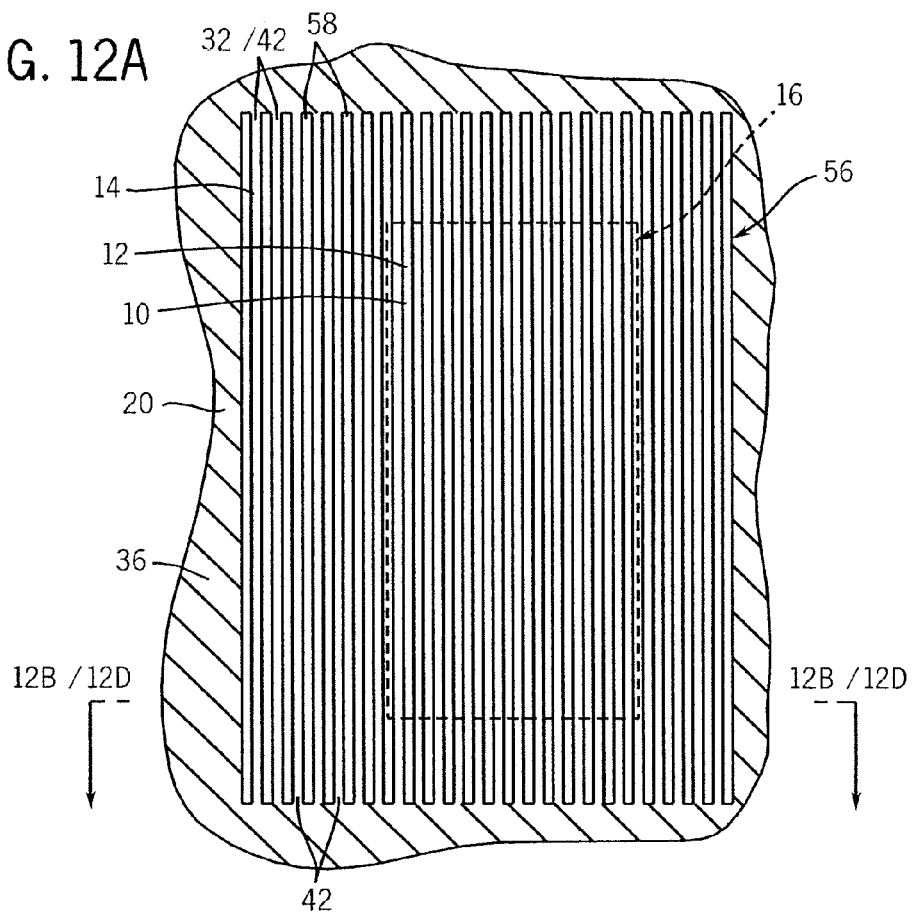
FIG. 12A illustrates a diagrammatic top plan view of a portion of the substrate of FIG. 6A at a subsequent stage.
Figure 12B:
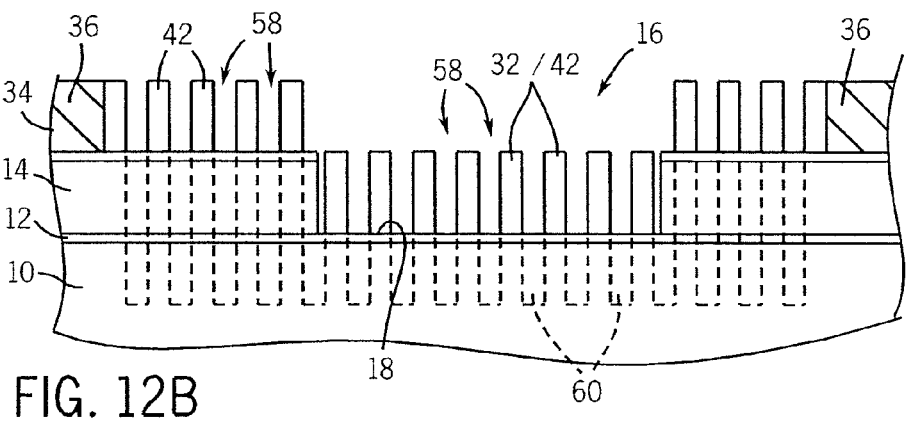
FIGS. 12B and 12D illustrate elevational, cross-sectional views of the substrate depicted in FIG. 12A taken along lines 12B/12D-12B/12D.
Figure 12C:
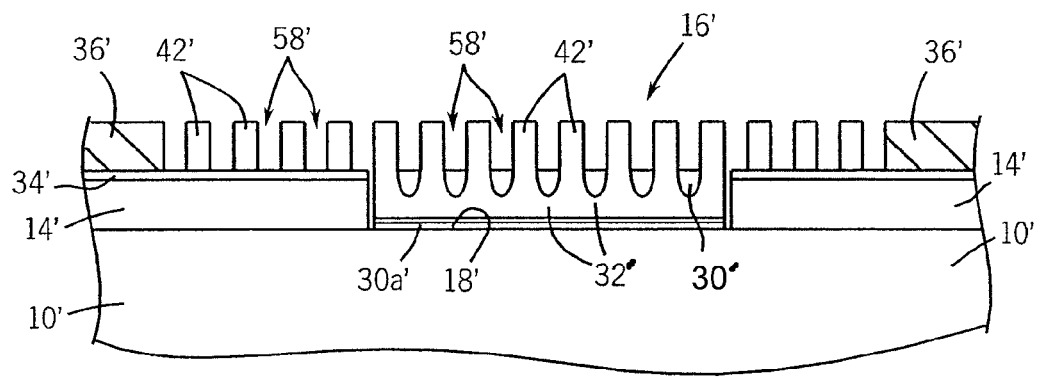
FIG. 12C illustrates an intermediate structure showing the removal of half-cylindrical domains in a step prior to FIG. 12D.

Referring now to FIGS. 12A-12C, after annealing and the lamellar-phase block copolymer material 36 is ordered to form film 38, one of the block components can be selectively removed to produce a thin film 56 (FIG. 12A) that can be used, for example, as a lithographic template or mask to pattern the underlying substrate 10 (and material layer 14 on the crests 20) in a semiconductor processing to define regular patterns in the nanometer size range (i.e., about 10 nm to 100 nm). Within the trenches 16, selective removal of both a lamellar domain (e.g., 40) and the underlying polymer domain of the base film (e.g., 30) is performed.

For example, as illustrated in FIG. 12B, selective removal of the PMMA domains 30, 40 will result in openings (slits) 58 separated by vertically oriented PS lamellar domains 32/42 with the trench floor 18 (e.g., neutral wetting layer 12 or substrate 10) exposed where the PMMA was removed. Removal of the PMMA phase domains 30, 40 can be performed, for example, by application of an oxygen (O$_2$) plasma, or by a chemical dissolution process such as acetic acid sonication by first irradiating the sample (ultraviolet (UV) radiation, 1 J/cm$^2$ 254 nm light), then ultrasonicating the film in glacial acetic acid, ultrasonicating in deionized water, and rinsing the film in deionized water to remove the degraded PMMA.

Figure 12D:
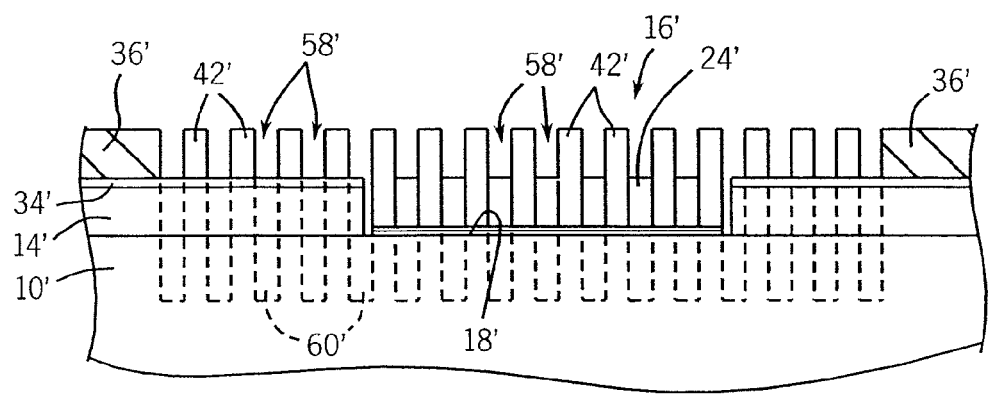

Referring to FIG. 12C, in the use of a cylindrical-phase base film (28' in FIG. 6C), the PS matrix 32' situated underneath the half-cylinders 30' and over the floors 18' of trench 16' remains after the removal of the PMMA domains, and is removed, for example, by plasma O₂ etch, prior to a patterning process to expose the underlying substrate 10' as illustrated in FIG. 12D.

In another embodiment, the selective removal of PS phase domains 32, 42 will result in openings (slits) 58 separated by PMMA lamellar domains 30, 40.

In some embodiments, the resulting films have a corrugated surface that defines a linear pattern of fine, nanometer-scale, parallel slits (openings) 58 about 5 nm to 50 nm wide and several microns in length (e.g., about 10 µm to 4000 µm), the individual slits 58 separated by a polymer matrix 42 about 5 nm to 50 nm wide. For example, removal of the PMMA domains affords a PS mask of sub-lithographic dimensions, for example, a pitch of about 35 nm (e.g., a 17.5 nm PS domain). A smaller pitch can be dialed in by using lower molecular weight diblock copolymers.

The films can be used, for example, as a lithographic template or etch mask to pattern (arrows ↓↓) the underlying substrate 10 (and layer 14), for example, by a non-selective RIE etching process, to delineate a series of channels or grooves 60, shown in phantom in FIG. 12B. In some embodiments, the channels can then be filled with a conductive material (e.g., metal) to form nanowire channel arrays for transistor channels, semiconductor capacitors, and other structures, or with a dielectric material to separate active areas. Further processing can then be performed as desired.

The films provide linear arrays having long range ordering and registration for a wide field of coverage for templating a substrate. The films are useful as etch masks for producing close-pitched nanoscale channels and grooves that are several microns in length, for producing features such as floating gates for NAND Flash with nanoscale dimensions. By comparison, photolithography techniques are unable to produce channels much below 60 nm wide without high expense. Resolution can exceed other techniques such as conventional photolithography, while fabrication costs utilizing methods of the disclosure are far less than electron beam (E-beam) or EUV photolithographies which have comparable resolution.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A substrate, comprising:
    a base polymer material within a trench in a material overlying a substrate and comprising an ordered array of polymer domains; and
    another polymer material comprising another ordered array of polymer domains, a first portion of the another ordered array of polymer domains on a surface of the base polymer material and comprising polymer domains registered to corresponding polymer domains of the base polymer material, and a second portion of the another ordered array of polymer domains overlying the material adjacent the trench.

2. The substrate of claim 1, wherein the base polymer material comprises alternating lamellar domains oriented parallel to sidewalls of the trench and perpendicular to a floor of the trench.

3. The substrate of claim 1, wherein the base polymer material comprises lines of half-cylinder polymer domains in a polymer matrix, the lines of half-cylinder polymer domains extending parallel to sidewalls of the trench and parallel to a floor of the trench.

4. The substrate of claim 1, wherein the another polymer material comprises lamellar polymer domains oriented perpendicular to a floor of the trench.

5. The substrate of claim 1, further comprising thermally conductive elements extending a length of the trench.

6. The substrate of claim 1, further comprising an absorptive material or a reflective material only located over a floor of the trench.

7. A substrate comprising:
    a base polymer material within trenches in a material overlying a substrate, the base polymer material confined within lateral boundaries of each of the trenches; and
    another polymer material on a surface of the base polymer material within the trenches and over portions of the material between the trenches, portions of the another polymer material on the surface of the base polymer material comprising polymer domains registered to corresponding polymer domains of the base polymer material.

8. The substrate of claim 7, further comprising a neutral wetting material between the another polymer material and the material.

9. The substrate of claim 7, further comprising a neutral wetting material underlying the material and the base polymer material.

10. The substrate of claim 7, further comprising a neutral wetting material substantially only located on floors of the trenches.

11. The substrate of claim 7, further comprising a reflective material on surfaces of the material.

12. The substrate of claim 7, further comprising an absorptive material on surfaces of the material.

13. The substrate of claim 7, further comprising lines of a thermally conductive material extending beneath the trenches.

14. A thin film structure, comprising:
    a material over a substrate and comprising at least one trench therethrough;
    an array of polymer structures laterally confined within boundaries defined by sidewalls of the at least one trench; and
    another array of polymer structures registered to and on surfaces of the array of polymer structures within the at least one trench and extending over the material adjacent the at least one trench, a pitch of two polymer structures of the another array of polymer structures the same as that of two other polymer structures of the array of polymer structures within the at least one trench.

15. The thin film structure of claim 14, wherein a thickness of each polymer structure of the array of polymer structures is less than a depth of the at least one trench.

16. The thin film structure of claim 15, wherein the thickness of each polymer structure of the array of polymer structures is about one-half the depth of the at least one trench.

17. The thin film structure of claim 14, wherein a thickness of each polymer structure of the array of polymer structures is greater than a depth of the at least one trench.

18. The thin film structure of claim 17, wherein the thickness of each polymer structure of the array of polymer structures is less than the pitch of the two polymer structures of the array of polymer structures.

19. The thin film structure of claim 14, further comprising an opening between the two polymer structures of the array of polymer structures, and between the two other polymer structures of the another array of polymer structures.

20. The thin film structure of claim 19, wherein the opening is from about 5 nanometers to about 50 nanometers wide.

21. The thin film structure of claim 19, wherein the pitch of the two polymer structures of the array of polymer structures is less than or equal to about 35 nanometers.

22. The thin film structure of claim 19, wherein the array of polymer structures comprises an array of polystyrene structures, and wherein the another array of polymer structures comprises another array of polystyrene structures on surfaces of the array of polystyrene structures.

23. The thin film structure of claim 19, wherein the array of polymer structures comprises an array of poly(methyl methacrylate) structures, and wherein the another array of polymer structures comprises another array of poly(methyl methacrylate) structures on surfaces of the array of poly(methyl methacrylate) structures.

24. The substrate of claim 1, wherein the base polymer material and the another polymer material comprise separate polymer films having substantially the same pitch.

25. The substrate of claim 7, wherein the base polymer material and the another polymer material comprise separate films.

* * * * *